United States Patent
Palm et al.

(12)

(10) Patent No.: US 12,074,231 B2
(45) Date of Patent: Aug. 27, 2024

(54) COLORED PLATE-SHAPED COMPONENT WITH STRUCTURED COVER PLATE AND COLOR FILTER LAYER

(71) Applicant: CNBM RESEARCH INSTITUTE FOR ADVANCED GLASS MATERIALS GROUP CO., LTD., Bengbu (CN)

(72) Inventors: Joerg Palm, Munich (DE); Sven Ring, Berlin (DE); Jan Kegel, Taucha (DE); Rene Kalio, Leipzig (DE); Manuel Dias, Wiesbaden (DE)

(73) Assignee: CNBM RESEARCH INSTITUTE FOR ADVANCED GLASS MATERIALS GROUP CO., LTD., Bengbu (CN)

( * ) Notice: Subject to any disclaimer, the term of this patent is extended or adjusted under 35 U.S.C. 154(b) by 4 days.

(21) Appl. No.: 17/795,643

(22) PCT Filed: Jan. 26, 2021

(86) PCT No.: PCT/CN2021/073743
§ 371 (c)(1),
(2) Date: Jul. 27, 2022

(87) PCT Pub. No.: WO2021/151374
PCT Pub. Date: Aug. 5, 2021

(65) Prior Publication Data
US 2023/0067441 A1    Mar. 2, 2023

(30) Foreign Application Priority Data

Jan. 28, 2020   (EP) ..................................... 20153986

(51) Int. Cl.
*H01L 31/044*    (2014.01)
*H01L 31/0216*   (2014.01)
(Continued)

(52) U.S. Cl.
CPC .................. *H01L 31/02162* (2013.01); *H01L 31/02167* (2013.01); *H01L 31/048* (2013.01); *H01L 31/0543* (2014.12)

(58) Field of Classification Search
CPC ....... H01L 31/00–078; H02S 20/00–32; H02S 40/20–22; Y02E 10/50–60
(Continued)

(56) References Cited

U.S. PATENT DOCUMENTS

2009/0151784 A1*  6/2009  Luan ................. H01L 31/02366
                                                438/69
2010/0060987 A1   3/2010  Witzman et al.
(Continued)

FOREIGN PATENT DOCUMENTS

CN        105144397 A    12/2015
EP          3599318 A1    1/2020
(Continued)

OTHER PUBLICATIONS

CIE DS 014-4.3/E, Colorimetry+Part 4: CIE 1976 L*a*b* Colour Space, CIE Draft Standard, 2007, pp. 1-8.
(Continued)

*Primary Examiner* — Bach T Dinh

(57) ABSTRACT

A plate-shaped component includes a transparent cover plate and a planar back element attached to the cover plate. The cover plate has a front surface facing the external environment and a back surface facing the back element. At least one surface selected from the front and back surfaces has at least one structured region, and at least one color filter layer for reflecting light within a predetermined wavelength range is arranged on the at least one surface selected from the front and back surfaces. The at least one structural region is perpendicular to the plane of the cover plate. The at least one color filter layer includes at least one refractive layer having (Continued)

a refractive index of greater than 2.5 in the wavelength range from 400 nm to at least 700 nm and an extinction coefficient of at least 0.2 below 450 nm and less than 0.2 above 700 nm.

20 Claims, 20 Drawing Sheets

(51) Int. Cl.
*H01L 31/048* (2014.01)
*H01L 31/054* (2014.01)

(58) Field of Classification Search
USPC .................................................. 136/243–265
See application file for complete search history.

(56) References Cited

U.S. PATENT DOCUMENTS

| | | | |
|---|---|---|---|
| 2010/0181014 A1* | 7/2010 | Raymond | G02B 17/086 |
| | | | 156/209 |
| 2014/0191262 A1* | 7/2014 | Kraus | H01S 5/00 |
| | | | 257/432 |
| 2017/0033250 A1 | 2/2017 | Ballif et al. | |
| 2017/0123122 A1 | 5/2017 | Ballif et al. | |
| 2018/0337629 A1 | 11/2018 | Liu et al. | |
| 2019/0081588 A1 | 3/2019 | Hody Le Caer et al. | |
| 2019/0386607 A1 | 12/2019 | Höhn et al. | |

FOREIGN PATENT DOCUMENTS

| | | |
|---|---|---|
| EP | 3599647 A1 | 1/2020 |
| EP | 3599649 A1 | 1/2020 |
| JP | 2012247483 A | 12/2012 |
| JP | 2013040091 A | 2/2013 |
| JP | 2014107504 A | 6/2014 |
| JP | 2017041590 A | 2/2017 |
| WO | 2020020015 A1 | 1/2020 |
| WO | 2020020016 A1 | 1/2020 |
| WO | 2020020019 A1 | 1/2020 |

OTHER PUBLICATIONS

DIN 5033-9, Colorimetry—Part 9: Reflectance standard for calibration in colorimetry and photometry, 2018, pp. 1-12.
ISO/CIE 10527, CIE standard colorimetric observers, International Standard, 1991, pp. 1-6.
ISO 7724/ 1, Paints and varnishes—Colorimetry—Part 1: Principles, International Standard, 1984, pp. 1-5.
ASTM Designation: E 1347-97, Standard Test Method for Color and Color-Difference Measurement by Tristimulus (Filter) Colorimetry, ASTM, 1997, pp. 1-4.
ASTM Designation: D 1003-00, Standard Test Method for Haze and Luminous Transmittance of Transparent Plastics, ASTM, 2000, pp. 1-6.
Benedikt Bläsi, et al., Morpho Butterfly Inspired Coloured BIPV Modules, 33rd European PV Solar Energy Conference and Exhibition, 2017.
S. Pélisset, et al., Efficiency of Silicon Thin-Film Photovoltaic Modules With a Front Coloured Glass, Proceedings CISBAT, 2011, pp. 37-42.
Simona Villa, Colored PV modules based on Interference Filters, the degree of Master of Science in Sustainable Energy Technology, Delft University of Technology, 2018, pp. 1-87.
Andrea Ingenito, et al., Phosphorous-Doped Silicon Carbide as Front-Side Full-Area Passivating Contact for Double-Side Contacted c-Si Solar Cells, IEEE Journal of Photovoltaics, 2018, pp. 1-9.
Hicham Charifi, et al., Opto-Structural Properties of Silicon Nitride Thin Films Deposited by ECR-PECVD, World Journal of Condensed Matter Physics, 2016, pp. 7-16, vol. 6.
Seyed Sadreddin Mirshafieyan, et al., Silicon colors: spectral selective perfect light absorption in single layer silicon films on aluminum surface and its thermal tunability, Optics Express, 2014, pp. 31545-31554, vol. 22, No. 25.

* cited by examiner

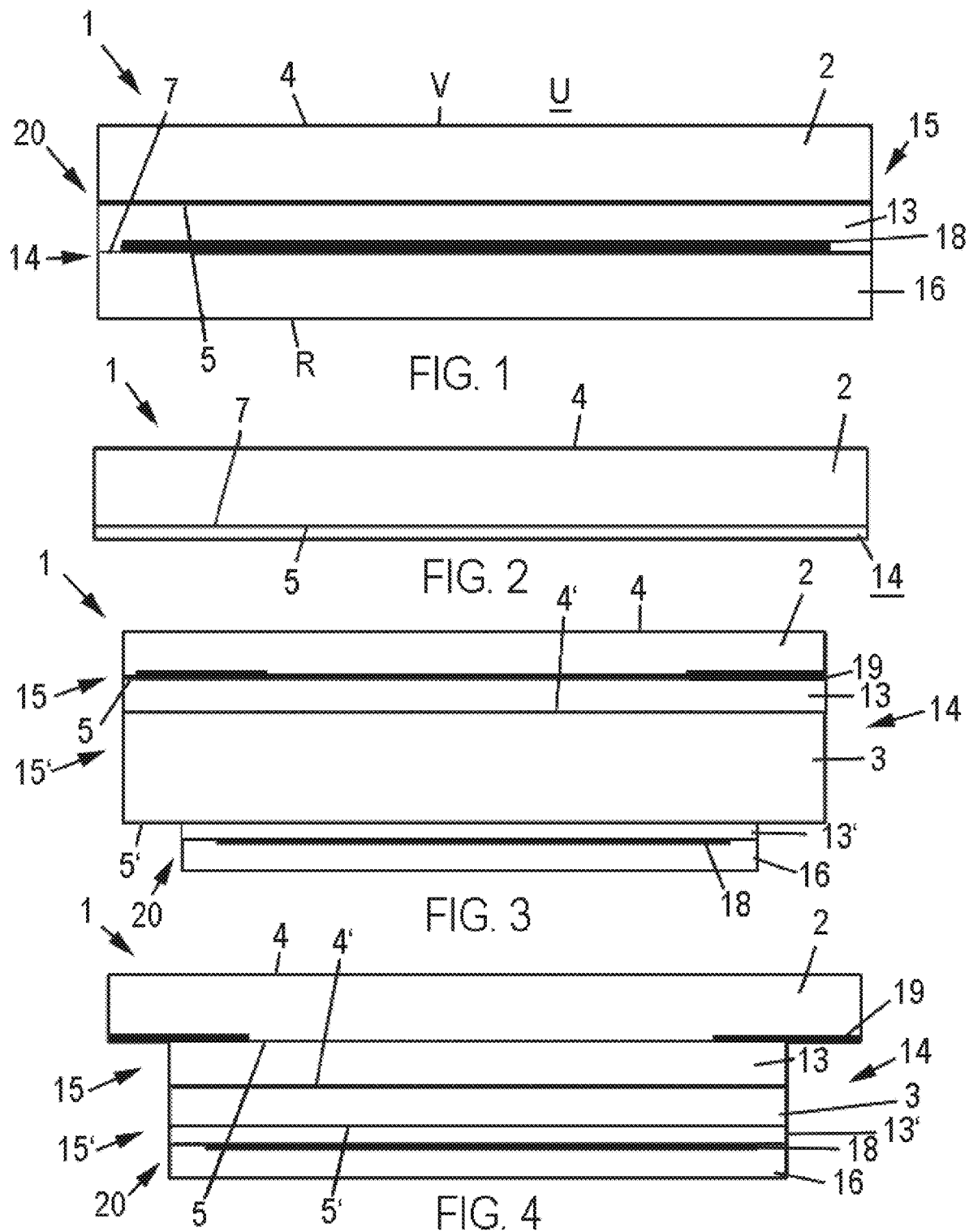

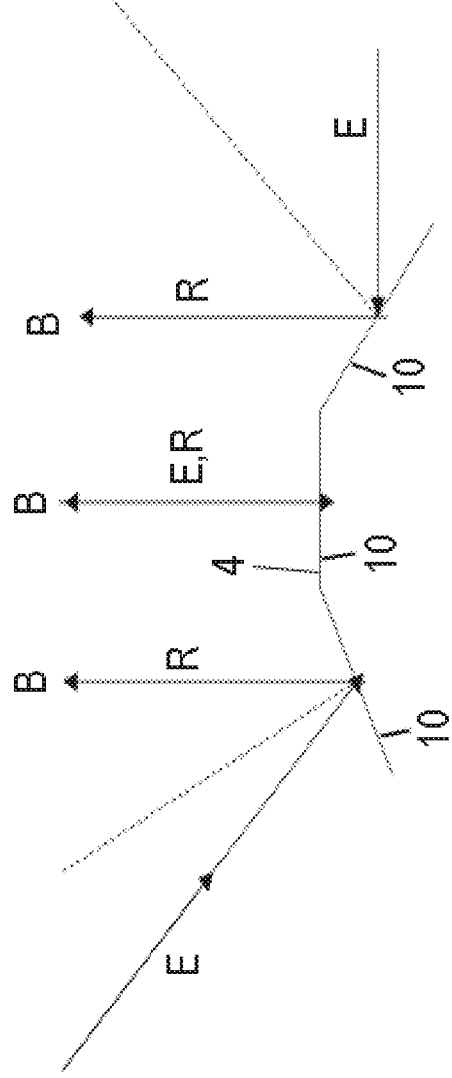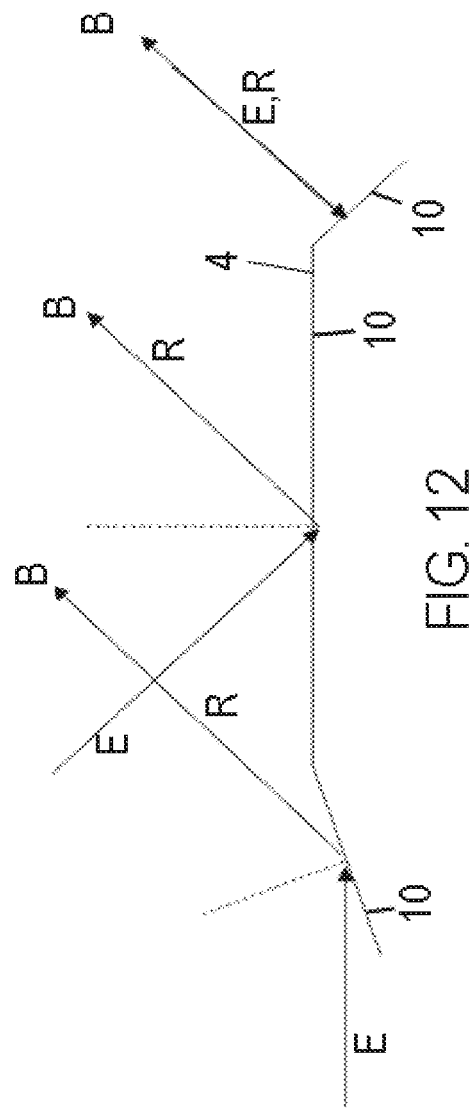

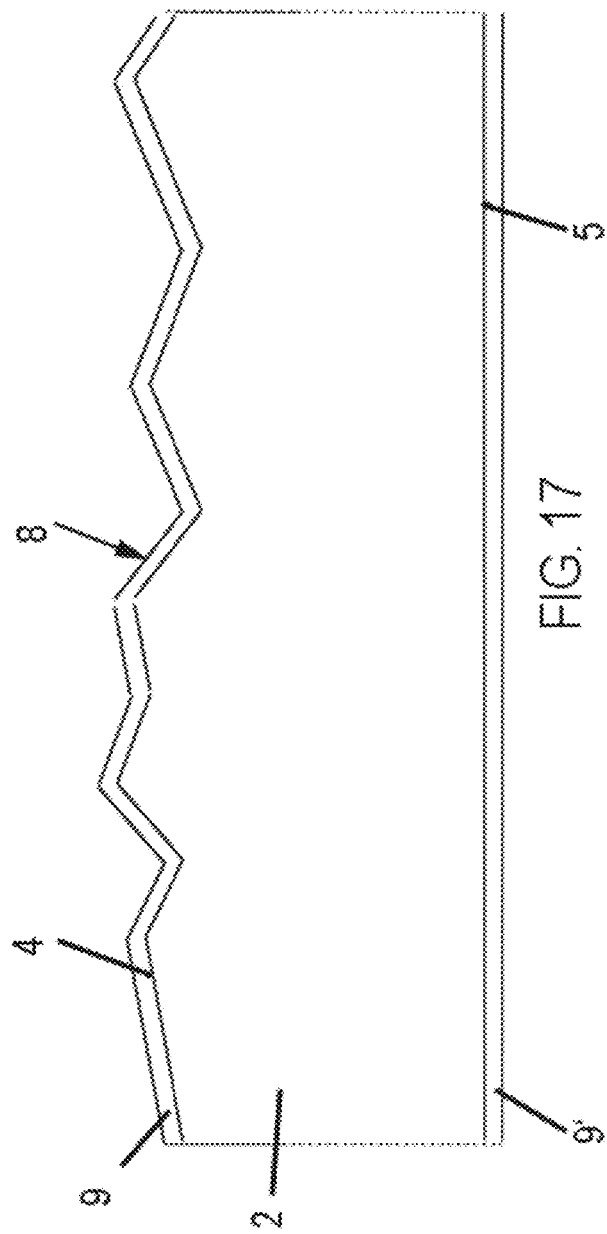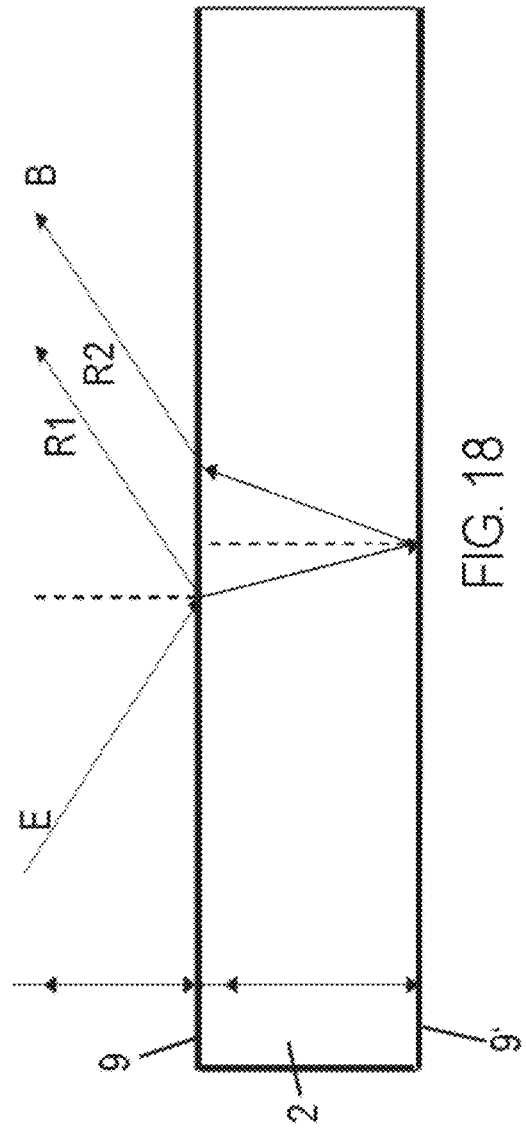

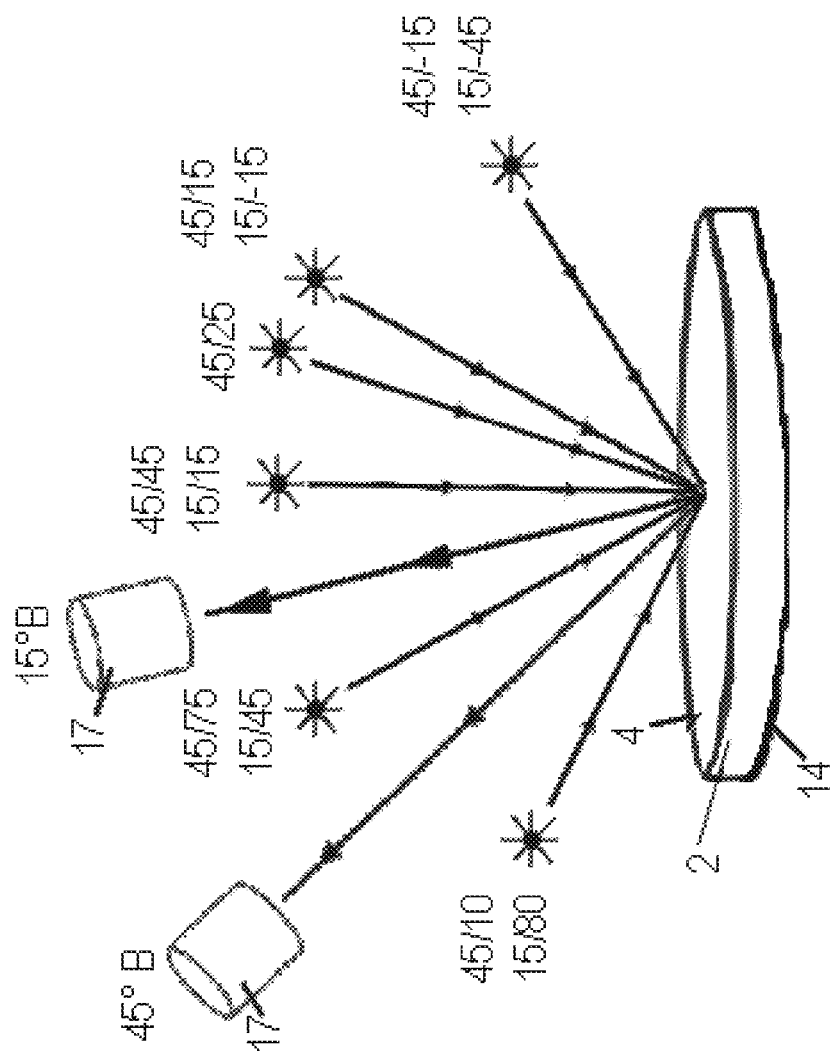

COLORED PLATE-SHAPED COMPONENT WITH STRUCTURED COVER PLATE AND COLOR FILTER LAYER

CROSS REFERENCE TO THE RELATED APPLICATIONS

This application is the national phase entry of International Application No. PCT/CN2021/073743, filed on Jan. 26, 2021, which is based upon and claims priority to European Patent Application No. 20153986.3, filed on Jan. 28, 2020, the entire contents of which are incorporated herein by reference.

TECHNICAL FIELD

The present invention is in the technical fields of facade manufacturing and solar module manufacturing and relates to a colored plate-shaped component with a structured cover plate and at least one color filter layer. The plate-shaped component is formed in particular in the form of a solar module or a facade element.

BACKGROUND

The use of solar modules as wall or facade elements is currently still a relatively small market in economic terms, but very interesting from an ecological point of view. Especially in view of increased efforts for decentralized energy solutions and energy-neutral buildings, the demand for the application of solar modules as integrated components of building envelopes is growing. This includes applications for roofs (integrated or surface-mounted) and facades. Other interesting areas of application for solar modules are noise barriers (road, rail), privacy screens in outdoor areas or walls for greenhouses or covers for the architectural design of bridges or towers. It would even be conceivable to use colored solar modules in ground-mounted systems if normal blue-black solar modules are not desired for reasons of landscape protection or special customer requirements. These new applications place completely new demands on solar modules, especially in terms of aesthetics, service life and other functionalities such as sealing and thermal insulation. In particular, the solar modules used for this purpose must be available in various shapes, sizes and colors and must convey as homogenous a color impression as possible. Depending on the origin of the color (absorption/emission, interference, refraction), the color of an inherently homogeneous surface of the solar module may depend on the viewing and/or irradiation angle. Furthermore, the spectrum and the spatial distribution (diffuse, directional) of the light also determine the color impression.

In terms of efficiency optimization, an ideal solar module would be a black body that completely absorbs the incident sunlight in order to optimally convert the radiant energy into electrical energy. However, incident radiation is reflected and absorbed radiation is remitted by every real body, whereby the color impression in the human eye basically results from the spectrally selected reflection and remission of light. The solar spectrum has the highest energy intensity in the visible spectral range and the human eye has the greatest sensitivity. If a solar module is designed in color, i.e., if a color impression of the solar module is to be created in the human eye that differs from the ideal black body, the intensity of the light absorbed in the photovoltaically active semiconductor is necessarily reduced and thus also the electrical output or the efficiency of the solar module. Optimal efficiency can basically only be achieved with a black solar module. On the other hand, depending on the origin of the color (absorption/emission, interference, refraction), the color of an intrinsically homogeneous surface of the solar module may depend on the viewing and/or irradiation angle. Furthermore, the spectrum and the spatial distribution (diffuse, directional) of the light also determine the color impression.

In the unpublished European patent applications EP 18186153.5 and EP18186161.8, solar modules are shown in which coloring is achieved by at least one optical interference layer. By structuring the front glass, a colored solar module is obtained which has a color effect that is largely stable for the human eye even from different viewing directions and under different lighting conditions, while still achieving an acceptable energy yield, in particular a good efficiency.

The specific dimensioning of a facade may require that colored solar modules in different sizes and shapes are needed to give the facade as homogeneous a color as possible. In general, smaller and non-rectangular solar modules lead to significant additional costs if the actual semiconductor stack is manufactured on a large area and smaller module sizes have to be produced by dividing, since smaller solar modules require a significantly higher material input per unit of output power.

In addition, the ratio of module area to module edge becomes less favorable with smaller solar modules, so the overall module efficiency is also smaller. Furthermore, the costs of certain materials and fixed costs for add-on parts and edge sealing have a higher share of the total costs for small solar modules. Furthermore, certain steps of the manufacturing process can only be implemented with strongly modified system concepts for different substrate sizes.

For the above-mentioned reasons, industrial series production of solar modules is geared to a few standard module sizes and, as a rule, the rectangular shape of the solar modules, so that covering the entire surface of a facade with solar modules is usually not possible or economically unacceptable. In addition, the photovoltaic design of the solar cells and various add-on parts such as contact strips, junction boxes and cables are optimized for the standard module sizes. In addition, unfavorable orientation to the sun or shading by parts of the same building or by neighboring buildings can make it uneconomical to cover certain regions of a facade with solar modules, since their energy yield does not earn the additional costs.

To solve the problem of lack of suitable sizes and/or shapes of colored solar modules, it is conceivable to use photovoltaic passive facade elements made of sheet metal or other conventional building materials, it being understood that their color should be as similar as possible to that of the colored solar modules. However, there is a technical and design problem here, which lies in the nature of color generation. In fact, depending on the origin of the color (absorption/emission, interference, refraction), the color of the solar modules can change under different lighting conditions, especially depending on the type of light (diffuse, direct, light color), as well as by changing the angle of incidence and/or observation. If the photovoltaic passive facade elements are made of different materials than the colored solar modules, this typically results in color contrasts that are undesirable from a design point of view.

A solution to this problem is given in the unpublished European patent application EP 18186175.8. Shown therein are photovoltaic passive facade elements in which, analogous to the unpublished European patent applications EP 18186153.5 and EP18186161.8, the front glass has a structuring and at least one optical interference layer is provided.

With the colored photovoltaic active solar modules or colored passive facade elements shown in the unpublished European patent applications EP 18186153.5, EP18186161.8 and EP 18186175.8, different colors such as green, blue, turquoise or yellow and also different shades of gray can be produced very well. The interference coatings used there are based on transparent dielectric layers such as $Si_3N_4$, $SiO_2$, $TiO_2$ and $ZrO_2$. However, white or red solar modules or facade elements are very difficult to realize, so that their production with an acceptable loss of efficiency remains a major technical challenge. Particularly with the colors white and red, high efficiency losses occur, since a large part of the visible spectrum must naturally be reflected. In addition, the refractive index for the material systems mentioned is limited to values below 3 in the visible spectrum (380 nm to 780 nm), so that at best light shades of gray can be achieved (L<60).

Generally, colors with values of L above 80 or even better 85 are considered white shades. In the RAL system, the darkest white is papyrus white with L=81: RAL 9018, papyrus white, L=81.34, a=−2.29, b=2.96.

To produce red solar modules or facade elements with interference layers, multiple layers are needed, because with one or two interference layers, the higher orders add blue components to the reflection spectrum, usually resulting in violet or purple tones. The multiple layers usually have a strong angular dependence.

In contrast, the task of the present invention is to provide a colored solar module or photovoltaic passive facade element in which a red and white color can also be realized in a simple manner. With a colored solar module, the loss of efficiency should be as low as possible. In addition, the color of the solar module or photovoltaic passive facade element should depend as little as possible on the light conditions and the viewing and irradiation angle, and it should be possible to produce them in various sizes and shapes at acceptable cost and with satisfactory homogeneity.

SUMMARY

These and further objects are solved according to the proposal of the invention by a plate-shaped component with the features of the independent claim. Advantageous embodiments of the invention are indicated by the features of the subclaims.

According to the invention, a colored plate-shaped component, in particular with a composite pane structure, is shown.

The term "plate-shaped component" generally refers to a component that is suitable and intended for use as a visible surface element. Preferably, the plate-shaped component is a solar module, in particular a thin-film solar module, which can be used, for example, in ground-mounted or roof-mounted systems. Equally preferably, the plate-shaped component is a photovoltaically active or passive facade element that serves to be installed in a facade. A photovoltaically active facade element is also a solar module. Generally, the facade has a front or outer side and a back or inner side, where the front side of the facade can be viewed from the external environment. The facade is, for example, a building wall or a free-standing wall that serves, for example, as a visual or noise barrier. The facade element can be integrated into a facade as an independent component, with the front surface of the facade element being part of the exterior or front surface of the facade. The front or outer surface of the facade element serves to allow light (e.g., sunlight) to fall onto the facade element. The back or inner side of the facade element is not used for viewing from the external environment, nor is it used for the incidence of light.

A "colored" plate-shaped component or "plate-shaped component with color effect" is understood to mean that the front or outer side of the plate-shaped component has a certain (selectable) color when exposed to light (e.g., sunlight).

By "composite pane structure" is meant that the plate-shaped component has at least two panes which are firmly joined together (e.g., laminated) by an intermediate layer.

According to the invention, a plate-shaped component with a color effect is shown, which comprises a transparent cover plate and at least one planar back element. In particular, the cover plate and the planar back element may be firmly connected to each other by an intermediate layer and form a composite pane. Preferably, the intermediate layer is a thermoplastic or crosslinking polymer intermediate layer (e.g., PVB or EVA). Bonding is also possible using a transparent silicone or casting resin.

For the purposes of the present invention, the term "transparency" or "transparent" refers to a transmittance for visible light of at least 85%, in particular at least 90%, preferably at least 95%, in particular 100%. Typically, visible light is present in the wavelength range from 380 nm to 780 nm. The term "opacity" or "opaque" refers to a visible light transmittance of less than 5%, in particular 0%. The term "semi-transparent" or "semi-transparent" refers to a visible light transmittance of less than 85% and at least 5%. The percentages refer to the intensity of the light, in each case measured on one side of the planar structure (e.g., pane) to be examined, relative to the intensity of the light's incident on the other side of the planar structure. For such a measurement, for example, a white light source (visible light source) can be placed on one side of the planar structure and a visible light detector on the other side of the planar structure. The values for the optical refractive index given below always refer to the optical refractive index in the visible wavelength range from 380 nm to 780 nm.

In the plate-shaped component according to the invention, the cover plate is used for coloring, as will be explained in more detail below. The coloring cover plate has a front surface arranged on the light incidence side and an opposite back surface. The front surface of the cover plate thus faces the external environment from which the front or outer surface of the plate-shaped component can be viewed. The back surface of the cover plate accordingly faces away from the external environment.

According to one embodiment of the plate-shaped component according to the invention, the cover plate is made of glass or plastic, preferably soda-lime glass. Preferably, the cover plate is formed as a rigid glass or plastic plate. In this case, the front surface or back surface of the cover plate is formed by the respective material of the cover plate. According to an alternative embodiment of the cover plate, the cover plate may be formed of at least two different materials, wherein the front surface and/or back surface is formed of a material different from a core of the cover plate. Preferably, the core of the cover plate is made of a same material, for example glass or plastic, preferably soda-lime glass. A material different from the core of the cover plate is applied to the outside and/or inside of the core of the cover plate, which material is transparent and has the same optical refractive index as the material of the core of the cover plate. In this case, the front surface or back surface is formed by the respective material applied to the core of the cover plate. According to the invention, the term "cover plate" thus also includes composite bodies, with the proviso that the materials forming the pane are transparent and have the same optical refractive index.

Preferably, the cover plate has no curvature and is thus planar (flat). However, the cover plate can also be curved. The cover plate can be rigid or flexible. A flexible cover plate can also be provided in a planar form. In the case of a planar (flat) cover plate, a plane is defined by the cover plate itself, which is to be understood as the "plane of the cover plate" in the sense of the invention. In the case of a curved cover plate, a local plane can be defined by an (imaginary) plane tangential surface at any point of the plane, which also comes under the term "plane of the cover plate".

The plate-shaped component according to the invention conveys a homogeneous color impression to the observer in at least one section when illuminated from the outside with white light, in particular when illuminated with sunlight, i.e., the plate-shaped component is colored. Preferably, the colored section extends over the entire front surface of the plate-shaped component. Plate-shaped components with a homogeneous color impression over the entire surface are considered to be particularly attractive.

The color of the plate-shaped component can be described by three color coordinates L*, a*, b*, whereby the color coordinates refer to the (CIE)L*a*b* color space known to the skilled person per se, in which all perceptible colors are exactly defined. This color space is specified in the European standard EN ISO 11664-4 "Colorimetry—Part 4:CIE 1976 L*a*b* Colour space", to which full reference is made in the present invention description. In the (CIE)L*a*b* color space, each color is defined by a color locus with the three Cartesian coordinates L+, a*, b*. On the a* axis, green and red are opposite each other, the b* axis runs between blue and yellow, and the L* axis describes the brightness (luminance) of the color. For a more descriptive representation, the quantities can be converted into the Lhc color space, where L remains the same and saturation is the radius and h the angle of a color point in the a*b* plane.

The color of the plate-shaped component refers to an observation from the external environment, i.e. in view of the front-side pane or cover plate. The color measurement or the determination of the color coordinates of the plate-shaped component can be carried out in a simple manner by means of a commercially available colorimeter (spectrophotometer). For this purpose, the colorimeter is directed at the front surface of the cover plate, in particular placed on the front surface. Common color measuring devices allow color measurement in compliance with standards, whereby their design and tolerances are typically subject to international standards, for example defined by DIN 5033, ISO/CIE 10527, ISO 7724 and ASTM E1347. For example, with regard to color measurement, reference is made in full to the DIN 5033 standard. A color measuring device has as a light source, for example, a xenon flash lamp, tungsten halogen lamp or one or more LEDs, whereby the front surface of a body is illuminated with the generated (e.g., white) light and the light received by the plate-shaped component is measured. As explained at the beginning, the body color measured by the colorimeter results from the reflected and remitted light from the plate-shaped component.

In order to achieve that the plate-shaped component according to the invention has a homogeneous color at least in one section, at least one surface (i.e., front surface and/or back surface) of the cover plate has at least one structured region. In addition, at least one coloring color filter layer is arranged on the cover plate. The at least one color filter layer makes the cover plate a coloring cover plate. The at least one color filter layer serves to reflect light within a predetermined or predeterminable wavelength range. The at least one color filter layer is preferably arranged directly (i.e. without any further intermediate layer) on a surface of the cover plate. Since the at least one color filter layer produces a colored reflection, it is no longer completely transparent. In the case of darker and unsaturated colors, the transmittance for visible light can still be more than 85%, while in the case of lighter and more saturated colors it is generally less than 85%.

The color filter layer can be designed with one or more layers, i.e., have one or more light-refracting layers (refraction layers). The color filter layer serves to generate the color of the cover plate and thus of the plate-shaped component, the color filter layer being designed, for example, in such a way that constructive or destructive interference of light reflected at the various interfaces of the color filter layer is possible. In this case, the color of the plate-shaped component results from the interference of the light reflected at the interfaces of the color filter layer. As will be shown below, even very thin layers that are too thin for constructive or destructive interference can be used as color filters by refractive index jumps and dispersion (dependence of refractive index on wavelength) alone. Furthermore, the present invention also uses materials for the color filter layers that exhibit partial absorption for a specific subrange of visible light. This selective partial absorption also contributes to coloration. Therefore, the coloring layers shall generally be referred to herein as color filter layers.

When illuminated with (white) light, in particular sunlight, the color filter layer acts as a color filter to produce a homogeneous color. Preferably, the structured region extends over the complete cover plate, i.e., over the complete surface (front surface and/or back surface) of the cover plate, so that the complete plate-shaped component has a homogeneous color. The plate-shaped component can also have several plate-shaped component sections, each with a homogeneous color. The colors of the plate-shaped component sections can be the same or different from each other.

The at least one structured region has a height profile perpendicular to the plane of the over plate with peaks (elevations) and valleys (depressions), a mean height difference between the peaks and valleys being at least 2 μm and preferably, but not necessarily, at most 20%, preferably at most 10%, more preferably at most 5%, of a thickness of the cover plate. Furthermore, at least 50%, preferably at least 80%, more preferably at least 90%, of the structured region of the surface (front and/or back surface) is composed of differently inclined segments or facets. The segments are sections of the surface of the cover plate facing the external environment and are each formed as planar surfaces which are inclined relative to the plane of the cover plate. Here, with respect to the plane of the cover plate, at least 20% of the segments have an angle of inclination in the range from greater than 0° to a maximum of 15° and at least 30% of the segments have an angle of inclination in the range from greater than 15° to a maximum of 45°. Advantageously, but not necessarily, less than 30% of the segments have an angle of inclination greater than 45°. The structures are preferably non-periodic and anisotropic. However, periodic structures and anisotropic structures can also be used for special optical effects.

Furthermore, the segments are each planar (planar) and have a segment area of at least 1 μm². Furthermore, in at least one zone (i.e., partial area) of the structured region, the segments each have an average roughness of less than 15%, preferably less than 10%, more preferably less than 5%, of a layer thickness of the color filter layer applied to the structured region. If the color filter layer is composed of a plurality of refractive layers, the segments of the at least one zone each have an average roughness of less than 15% of a layer thickness of the refractive layer having the lowest layer thickness. The zone in which the segments each have an average roughness of less than 15% of a layer thickness of the color filter layer may correspond to the structured region, i.e., the zone and the structured region are then identical. The structured region can be produced, for example, by etching, sandblasting or rolling the cover plate.

Accordingly, the at least one structured region of the cover plate has a plurality of planar (planar) segments. For the purposes of the present invention, planar (planar) segments may be formed by non-curved surfaces. However, it is also possible that planar (planar) segments are formed by slightly curved surfaces. A segment is slightly curved in the sense of the present invention, if for each point of the segment the following applies: if at a point of the segment an (imaginary) tangential plane with an area of 1 µm² is constructed, the distance between the area of the segment and the tangential plane, referred to the normal direction to the tangential plane, is less than 50 nm.

For the purposes of the present invention, the term "structuring" or "structured region" in the context of the plate-shaped component refers to a region of the front surface or back surface of the cover plate in which the features described above are present in combination.

Due to the features of the structured region, it can be achieved in an advantageous way that, when the cover plate is illuminated with light, light is reflected with relatively high intensity even when observed outside the gloss angle (angle of incidence of the incident light corresponds to angle of reflection of the reflected light, relative to the plane of the coloring cover plate). The reason for this is the differently inclined segments, which are present in sufficient number, suitable size and suitable angles of inclination to allow high intensity of the reflected light even when observed outside the gloss angle. There are always a sufficient number of inclined segments which, when structured externally by refraction at the segments and when structured internally by reflection at the segments, scatter sufficient intensity in directions outside the gloss angle of the coloring cover plate.

As used herein and further, the term "gloss angle" refers to the normal to the plane of the coloring cover plate, as opposed to the "local gloss angle" which refers to the normal to the plane of a segment. Gloss angle and local gloss angle can be the same (segment is parallel to the plane of the coloring first pane), but are usually different (segment is inclined to the plane of the coloring cover plate).

As a result, it can be achieved that the intensity of the light not reflected (i.e., scattered) in the gloss angle is relatively high, which, compared to a reflective surface without such a structured region, has only a low angular dependence with respect to the direction of incidence and observation. By means of the color filter layer, the light reflected outside the gloss angle can be subjected to color selection, depending on the refractive index and layer thickness of the color filter layer, so that the surface of the coloring cover plate has a homogeneous color with relatively low angular dependence. The color filter layer acts as a filter with the narrowest possible reflection and a broadband transmission.

Advantageously in this respect, the structured region has a height profile in which an average height difference between the peaks and valleys is at least 2 µm, preferably at least 10 µm and particularly preferably at least 15 µm. Such a structured region can be produced by etching the cover plate (e.g., of glass). Equally advantageously in this respect, the structured region has a height profile in which an average height difference between the peaks and valleys is at least 50 µm, preferably at least 100 µm. Such a structured region can be produced by rolling the coloring cover plate (e.g., made of glass). Accordingly, the invention advantageously extends to a plate-shaped component whose at least one structured region of the coloring cover plate is produced by etching or rolling, whereby said height profiles are producible.

However, the structures can also be created by applying a transparent and structured layer to the coloring cover plate. In this case, the layer must have the same (or at least very similar) refractive index as the cover plate. According to the invention, the structuring of a surface of the coloring cover plate shall also comprise the application of such a transparent and structured layer.

The aforementioned properties of the structured region of the coloring cover plate can be measured by conventional measuring instruments, such as a microscope, in particular a confocal microscope or a needle profilometer.

Preferably, the at least one structured region of the (uncoated) cover plate of the plate-shaped element according to the invention ensures that a brightness L of the reflected light of at least 10 occurs at observation angles of 45° and 15° (in each case relative to the plane of the cover plate) and an angle of incidence which deviates by 45° from the respective gloss angle (in both directions). Preferably, a brightness L of the reflected light of at least 15 and more preferably at least 20 occurs. In this measurement, a black cover is applied to the (uncoated) cover plate facing away from the side to be characterized (i.e., back surface). A D65 emitter is used for the measurement and the brightness L is measured with a commercially available multi-angle colorimeter (10° aperture angle). The measurement setup is explained in more detail below in connection with FIG. 26. In this context, full reference is made to the European standard EN ISO 11664-4.

The color of the plate-shaped component results from the color selected by the at least one color filter layer when illuminated with white light (e.g. sunlight), the selected color being combined with the background color of the back element. The overall impression thus results from the selected color and background color.

The plate-shaped component has at least one planar back element on its back side. Preferably, the at least one planar back element is opaque or semi-transparent. The planar back element is arranged at the back of the plate-shaped component, i.e., in the direction of the incidence of light behind the cover plate.

The at least one back element contributes to the coloration of the plate-shaped component. For this purpose, the back element is, for example, achromatic, dark and matte. It is also possible that the back element is colored in order to impart a certain (predetermined or predeterminable) color impression to the plate-shaped component in combination with the at least one coloring color filter layer, which is arranged on the cover plate.

As already explained, the cover plate has a front surface facing the external environment and a back surface opposite it. The front surface of a respective pane faces the external environment in the installed state of the plate-shaped component in the facade. The at least one planar back element has a contact surface which is firmly connected to the back surface of the cover plate.

For example, the at least one planar back element covers at least 70%, at least 90%, or at least 99% of the back surface of the cover plate. In particular, the planar back element covers the entire back surface of the cover plate (100%, i.e., complete coverage). However, it is also possible that the at least one planar back element covers less than 70%, in particular less than 50%, of the back surface of the cover plate.

According to a preferred embodiment of the plate-shaped component according to the invention, the at least one planar back element is designed to be photovoltaically active, i.e., suitable and intended for generating energy from sunlight. The colored plate-shaped component can thus be used in an advantageous manner for photovoltaic energy generation.

The at least one planar back element can be photovoltaically active or passive. If the back element is photovoltaically active and features, for example, CIGS thin film solar cells, these contribute to the overall color. The CIGS thin film solar cells typically have a bluish-black color.

Preferably, the photovoltaically active back element is a carrier substrate (pane) with series-connected solar cells applied thereto, wherein the carrier substrate is preferably directly, i.e., without an intermediate pane, firmly connected to the cover plate by an intermediate layer (e.g., by lamination).

In principle, it can be any type of solar cells, in particular silicon-based solar cells on wafer basis (solar cells on carrier substrate in superstrate configuration) or thin-film solar cells that are series-connected in monolithically integrated form (solar cells on carrier substrate in substrate or superstrate configuration). Preferably, these are thin-film solar cells that are series-connected in monolithically integrated form.

By laminating the cover plate with the carrier substrate and applied solar cells, a (thin-film) solar module with a composite pane structure is created. The interlayer is preferably a thermoplastic or crosslinking polymer interlayer (e.g., PVB or EVA). Bonding is also possible using a transparent silicone or casting resin.

The photovoltaically active back element preferably has thin-film solar cells in a substrate configuration in which the layer structure for producing the solar cells is deposited on a surface of the carrier substrate facing the light entrance side. Consistent with common usage, the term "thin-film solar cells" refers to a layer structure with a small thickness of, for example, a few micrometers, such that a supporting substrate is required for sufficient mechanical strength. The carrier substrate can, for example, consist of inorganic glass or plastic and, depending on the respective layer thickness and the specific material properties, can be designed as a rigid plate or flexible film. Preferably, the carrier substrate is made of glass.

In thin-film solar cells, the layer structure comprises a back electrode layer, a front electrode layer and a photovoltaically active absorber layer arranged between the back and front electrode layers. The front electrode layer is optically transparent, since light must be able to pass through to the layer structure. The optically transparent front electrode layer typically comprises or consists of a doped metal oxide (TCO=Transparent Conductive Oxide), for example n-type, in particular aluminum-doped, zinc oxide (AZO).

Preferably, the photovoltaically active absorber layer comprises or consists of a chalcopyrite semiconductor, which is advantageously a ternary I-III-VI compound semiconductor selected from the group consisting of copper-indium/gallium-disulfide/diselenide $(Cu(In,Ga)(S,Se)_2)$. In the above formula, indium and gallium may each be present alone or in combination. The same applies to sulfur and selenium, each of which may be present alone or in combination. A particularly suitable material for the absorber layer is CIS (copper-indium-diselenide/disulfide) or CIGS (copper-indium-gallium-diselenide, copper-indium-gallium-disulfide, copper-indium-gallium-disulfoselenide). The absorber layer typically has a doping of a first conductivity type (charge carrier type) and the front electrode has a doping of the opposite conductivity type. As a rule, the absorber layer is p-type (p-doped), i.e., has an excess of defect electrons (holes), and the front electrode layer is n-type (n-doped), so that free electrons are present in excess. A buffer layer is typically arranged between the absorber layer and the front electrode layer. This applies in particular to absorber layers based on $Cu(In,Ga)(S,Se)_2$, where a buffer layer is generally required between a p-type $Cu(In,Ga)(S,Se)_2$ absorber layer and an n-type front electrode. According to current knowledge, the buffer layer enables electronic matching between the absorber and the front electrode. It also provides protection against sputtering damage in a subsequent process step of depositing the front electrode, for example by DC magnetron sputtering. The sequence of n-type front electrode layer, buffer layer and p-type absorber layer form a p-n-heterojunction, i.e., a junction between layers of opposite conduction type. The photovoltaically active absorber layer can also consist of cadmium telluride (CdTe) or amorphous and/or microcrystalline silicon, for example.

In the layer structure, series-connected solar cells are formed by structuring zones. Thus, at least the back electrode layer is divided by first structuring lines (P1 lines) into sections completely separated from each other, which form the back electrodes of the solar cells. Furthermore, at least the absorber layer is divided by second structuring lines (P2 lines) into sections completely separated from each other, which form the absorbers of the solar cells, and at least the front electrode layer is divided by third structuring lines (P3 lines) into sections completely separated from each other, which form the front electrodes of the solar cells. Adjacent solar cells are electrically connected to each other via electrically conductive material in the second patterning lines in series connection, wherein the front electrode of a solar cell is electrically connected to the back electrode of the adjacent solar cell and typically, but not necessarily, has direct contact with the latter. Each patterning zone comprises a direct sequence of the three patterning lines P1-P2-P3, each in this order.

Thin-film modules based on amorphous and/or microcrystalline silicon and based on CdTe are mostly constructed in superstrate configuration. The thin-film solar cells are thus arranged on the light-entry side surface of the glass. On the back side, there is usually a second glass for climate-stable encapsulation. In this configuration, too, they can be connected in one of the embodiments shown here to form a colored plate-shaped component as a colored solar module or a colored facade element.

Consistent with common usage, the term "solar cell" in thin-film solar cells refers to a region of the layered structure that includes a front electrode, a photovoltaically active absorber, and a back electrode and is bounded by two immediately adjacent patterning zones. Each solar cell has an optically active zone which, stacked one on top of the other, comprises a back electrode, an absorber and a front electrode and is capable of photoelectric conversion of light into electric current.

The planar back element is firmly connected to the cover plate. The planar back element can itself have a color, whereby the color of the back element influences the overall color of the plate-shaped component.

According to an embodiment of the plate-shaped component according to the invention, the back element has a mechanically supporting pane. This measure enables the plate-shaped component to withstand higher wind loads. Preferably, the mechanically supporting pane is firmly connected to the cover plate by an intermediate layer.

According to an embodiment of the plate-shaped component according to the invention, the planar back element is photovoltaically passive, i.e., not intended and suitable for energy generation by sunlight.

The photovoltaically passive back element is formed, for example, in the form of a coating, in particular an opaque coating, of the back surface of the cover plate. Similarly, the back element may be formed, for example, in the form of a foil, in particular an opaque foil, firmly bonded to the back surface of the cover plate, or a rigid body (no coating), in particular an opaque rigid body, for example in plate form. The rigid body may be a supporting body or a non-supporting body and, as a supporting body, may in particular be a support plate. A film or body may be bonded to the cover plate by a transparent adhesive, in particular a transparent adhesive film.

In particular, the color of the photovoltaic passive planar back element may be selected to correspond to the opaque background of colored solar modules, i.e., the back element may have a color corresponding to the optically active solar cells. Preferably, the photovoltaic passive planar back element is achromatic, dark and matte. Then, the color impression and its angular dependence of the plate-shaped component can be particularly well matched with the correspondingly manufactured colored modules based on thin-film modules. These properties can be described as follows:
- an L-value of maximum 50, preferably less than 45 or less than 40;
- a chroma $c=(a2+b2)^{1/2}$ of at most 5, preferably less than 2 or more preferably less than 1.5.

To avoid gloss, the following additional requirement can be added:
- a reflection haze of at least 90%, where reflection haze is the proportion of diffuse reflected light to total reflected light.

Various embodiments of the coloring cover plate of the plate-shaped component according to the invention are described below.

According to an embodiment (hereinafter referred to as "type I" for ease of reference) of the plate-shaped component, the front surface of the coloring cover plate has at least one structured region on which a coloring (transparent or semi-transparent) color filter layer is arranged for reflecting light within a predetermined or predeterminable wavelength range. The color filter layer is preferably arranged directly (i.e., without any further intermediate layer) on the front surface of the cover plate.

In the above embodiment according to type I, it can be advantageous if the back surface of the coloring cover plate has no structured region and no color filter layer. The back surface is then preferably smooth (within the scope of production inaccuracies).

In the above embodiment according to type I, it may be further advantageous if the back surface of the coloring cover plate does not have a structured region, wherein a further color filter layer is arranged on the back surface of the coloring cover plate for reflecting light within a predetermined wavelength range. The back surface is preferably smooth (within production inaccuracies). The two color filter layers may be the same or different from each other. In particular, the two color filter layers may be designed to reflect light within a same wavelength range. However, it is also possible that the two color filter layers are designed to reflect light within different or only partially overlapping wavelength ranges. The layer thicknesses and refractive indices of the two color filter layers can be the same or different from each other. By this measure, the color of the plate-shaped component can be defined even better. In addition, mixed colors can be generated.

In the above type I embodiment, it may be further advantageous if the back surface has at least one structured region on which a color filter layer is arranged for reflecting light within a predetermined wavelength range. The structured region of the back surface and the structured region of the front surface may be the same or different. The thicknesses and refractive indices of the two color filter layers may be the same or different from each other. This measure can also be used to further define the color of the plate-shaped component. In addition, mixed colors can be generated.

In the plate-shaped component according to type I, a color with high intensity and low angular dependence is already produced when the light strikes the structured front surface of the cover plate with interference layer due to reflection, transmission, partial absorption and interference, even outside the gloss angle. The additional color filter layer and/or structuring on the back surface of the cover plate can further enhance this effect.

According to a further embodiment (hereinafter referred to as "type II" for ease of reference) of the plate-shaped component, a coloring (transparent or semi-transparent) color filter layer is arranged on the back surface of the coloring cover plate for reflecting light within a predetermined or predeterminable wavelength range. The color filter layer is preferably arranged directly (without any further intermediate layer) on the back surface of the coloring cover plate. In addition, the back surface and/or the front surface of the coloring cover plate each has at least one structured region, with the proviso that either the front surface has at least one structured region or a further color filter layer for reflecting light within a predetermined or predeterminable wavelength range is arranged on the front surface. The color filter layer is preferably arranged directly (without any further intermediate layer) on the front surface of the coloring cover plate. This means that no color filter layer is arranged on the front surface if the front surface has at least one structured region.

Accordingly, the incident light must pass through the cover plate at least once and be reflected at the internal color filter layer in order to achieve the desired colorfulness with the improved angular stability. Due to the internally and/or externally structured surface of the coloring cover plate, light with a high intensity and low angular dependence is also reflected outside the gloss angle, since the internally located color filter layer represents a boundary surface with a higher refractive index. With external structuring, the light is already refracted at the interface between the air and the pane and is diffusely scattered from a wide variety of angles onto the internal color filter layer. In the case of internal structuring only, the diffuse scattering takes place at this internal interface, since according to the invention many surface segments with different angles of inclination are available. In addition, a good homogeneous color impression is achieved by the color filter layer. The color filter layer thus acts as a filter with the narrowest possible reflection and broadest possible transmission.

In the above type II embodiment, it may be advantageous if a color filter layer is arranged on the back surface of the coloring cover plate, wherein the back surface of the coloring cover plate has no structured region and the front surface of the coloring cover plate has at least one structured region, wherein no further color filter layer is arranged on the front surface of the coloring cover plate. The back surface is preferably smooth (within production inaccuracies). There is no roughness condition for the segments of the structured region of the front surface of the plate-shaped component. The structured front surface can also have a greater microscopic roughness.

At this interface, only transmission, refraction and scattering take place, but no interference. In this embodiment of the plate-shaped component according to the invention, it may be advantageous if the front surface of the coloring cover plate is coated with a (e.g., thin) antireflection layer whose optical refractive index is smaller than that of the coloring cover plate. This can suppress an essentially achromatic reflection of the coloring cover plate (e.g., glass) and increase the saturation level of the colors. However, an additional layer on the front surface of the cover plate can also have the same refractive index as the cover plate. In this case, the layer serves only to protect the coloring cover plate from moisture and other corrosive components of the air. Etched satinized glasses have been shown to be more sensitive to moist heat than planar or rolled glasses. In the case of etched soda-lime glass, the additional layer can be, for example, a thin sputtered $SiO_2$ layer.

In the above type IT embodiment, it may be further advantageous if a color filter layer is arranged on the back surface of the coloring cover plate, wherein the back surface of the coloring cover plate has at least one structured region and the front surface has at least one structured region, wherein no further color filter layer is arranged on the front surface of the coloring cover plate. The structured region of the back surface and the structured region of the front surface of the coloring cover plate may be the same or different from each other. There is no roughness condition for the segments of the structured region of the front surface. The structured front surface can also have greater microscopic roughness. At this interface, only transmission, refraction and scattering occur, but no interference. For the segments of the structured region of the back surface, the above condition for roughness applies because a color filter layer is placed on the structured region. If the front surface is structured and the color filter layer is on the back surface, the angular stability arises from the fact that the light is refracted at the differently inclined segments as it enters through the structured front surface, strikes the color filter layer at different angles and, after interference, partial absorption and reflection, passes through the structured front surface a second time as it exits from the coloring cover plate, again changing its direction by refraction.

In the above embodiment of type II of the plate-shaped component, it may be further advantageous if a color filter layer is arranged on the back surface of the coloring cover plate, wherein the back surface of the coloring cover plate has at least one structured region and the front surface of the coloring cover plate has no structured region, wherein no further color filter layer is arranged on the front surface of the coloring cover plate. The front surface is preferably smooth (within production inaccuracies). For the segments of the structured region of the back surface, the above condition for roughness applies, since a color filter layer is arranged on the structured region. In this embodiment of the plate-shaped component according to the invention, it may be advantageous if the front surface of the coloring cover plate is coated with a (e.g., thin) anti-reflective layer whose refractive index is smaller than that of the cover plate. This can suppress an essentially white reflection of a glass cover plate and increase the degree of saturation of the colors.

In the above type II embodiment, it may be further advantageous if the back surface of the coloring cover plate has at least one structured region and the front surface has no structured region, wherein a further color filter layer is arranged on the front surface of the coloring cover plate. The front surface is preferably smooth (within production inaccuracies). For the segments of the structured region of the back surface, the above condition for roughness applies, since a color filter layer is arranged on the structured region. The two color filter layers may be the same or different from each other. In particular, the two color filter layers may be designed to reflect light within a same wavelength range. However, it is also possible that the two color filter layers are designed to reflect light within different or only partially overlapping wavelength ranges. The color filter layer on the smooth outer side can also be a color-neutral anti-reflective layer to reduce the white component of the total reflected light. The color is produced by reflection on the structured inner side with the color filter layer. However, the color filter layer on the smooth outer side can also be a color-generating layer that enhances the color generated on the inner side or mixes another color component in a different wavelength range with it.

Accordingly, the incident light must pass through the coloring cover plate at least once and must be reflected by the internal color filter layer in order to achieve the desired colorfulness with the improved angular stability after exiting the front surface of the coloring cover plate.

In the plate-shaped component according to the invention, light is reflected by the structured cover plate with a high intensity and low angle dependence, even outside the gloss angle. The at least one color filter layer, which has a coloring effect, creates a very homogeneous color impression.

In an advantageous embodiment of the plate-shaped component according to the invention, at least 80%, particularly preferably at least 90%, of a structured region of the front surface or the back surface (depending on which surface is structured) of the coloring cover plate is composed of the segments inclined to the plane of the coloring cover plate. By increasing the number of segments, the intensity of the light reflected from the structured region of the surface of the coloring cover plate even outside the gloss angle and its angular stability can be further increased.

In an advantageous embodiment of the plate-shaped component according to the invention, the angles of inclination of the (surface) segments are between 0° and 45° to the plane of the cover plate (glass plane). At least 50%, preferably 70%, of the inclined segments should have an angle of attack of less than 25°. The distribution of the angles of attack should have a frequency maximum in the angular range of 0°-35°, preferably 0°-25°, which lies in the range of 5°-25°, preferably between 10° and 20°. Furthermore, the proportion of non-inclined surfaces (angle of attack=0°) should be less than 5% of the total angle distribution.

In an advantageous embodiment of the plate-shaped component according to the invention, the aspect ratio of width (B) to height (H) of the structures (segments) is at least B:H>2:1 and B:H<50:1, preferably B:H>3:1 and B:H<10:1.

In a further advantageous embodiment of the plate-shaped component according to the invention, at least 30% of the segments of at least one structured region have a tilt angle in the range from greater than 0° to a maximum of 15°, at least 40% of the segments have a tilt angle in the range from greater than 15° to a maximum of 45°, and preferably, but not necessarily, less than 10% of the segments have a tilt angle greater than 45°. If there are relatively many facets with a small inclination angle of less than 10°, essentially only reflected intensity will occur (as with an unstructured surface) at an angle of observation close to the gloss angle, which is not desirable according to the invention. According to the above conditions, a very high intensity of the reflected light can be achieved even outside the gloss angle while at the same time having a particularly low angular dependence of the intensity. The structures are preferably non-periodic—and anisotropic. However, periodic structures and/or anisotropic structures can also be used for special optical effects. Periodic and anisotropic structures such as pyramids, tetragonal or hexagonal honeycomb structures, or hemispheres can be readily produced with rollers during glass drawing. They can be used to create attractive gloss and color effects. If the surface structures meet the above conditions, the plate-shaped components again show a significantly reduced decrease in coloration for angles outside the gloss angles, but the angular dependencies are then anisotropic with respect to the orientation in the plane of the cover plate.

The at least one color filter layer can contain one or more refractive layers and in particular consist of these. A refractive layer consists of the same material (with the same composition) and, in particular, has a homogeneous (same) refractive index across the layer thickness. If the color filter layer contains several refractive layers, at least two refractive layers consist of a different material and have a different refractive index.

The at least one color filter layer contains at least one refractive layer made of a highly refractive and partially transparent material, hereinafter referred to as "highly refractive layer", abbreviated as "HTM". The highly refractive layer (HTM) consists of a material with a refractive index n of greater than 2.5 in the wavelength range from 400 nm to at least 700 nm and an extinction coefficient of at least 0.2 below 450 nm and less than 0.2, preferably less than 0.1, above 700 nm. This makes it possible in a particularly advantageous manner to produce colored plate-shaped components with a white or red color, although other colors are also possible.

According to an advantageous embodiment of the plate-shaped component according to the invention, the at least one highly refractive layer has an extinction coefficient of less than 0.2, preferably less than 0.1 above 500 nm, with respect to the generation of a white or red color of the plate-shaped component.

According to a further advantageous embodiment of the plate-shaped component according to the invention, the at least one highly refractive layer has a refractive index n of greater than 3.0, preferably greater than 3.5, in the wavelength range from 400 nm to at least 700 nm, with respect to producing a white or red color of the plate-shaped component.

According to a further advantageous embodiment of the plate-shaped component according to the invention, the at least one highly refractive layer has a layer thickness in the range from 5 nm to 300 nm, preferably in the range from 5 nm to 40 nm, with regard to producing a white or red color of the plate-shaped component.

According to a further advantageous embodiment of the plate-shaped component according to the invention, the at least one highly refractive layer has, with respect to the production of a white color of the plate-shaped component, a refractive index n of greater than 3.0, preferably greater than 3.5, in the wavelength range from 400 nm to at least 700 nm and a layer thickness in the range from 5 nm to 40 nm.

For example, the high refractive index layer includes at least one material selected from: crystalline or microcrystalline Si, amorphous a-Si:H (amorphous hydrogen-passivated silicon), a-SiC:H (amorphous hydrogen-passivated silicon rich silicon carbide), a-SiO:H (amorphous hydrogen-passivated silicon rich silicon oxide), a-SiGe:H, silicon rich $Si_xN_y$, silicon rich $Si_xN_yO_z$ (y>z), $Cu_2O$ and $Fe_2O_3$. The high refractive index layer may also consist of the selected at least one material.

According to a further advantageous embodiment of the plate-shaped component according to the invention, the at least one color filter layer comprises at least one refractive layer of a transparent dielectric material with a refractive index of less than 2.5, hereinafter referred to as "low refractive index refractive layer", abbreviated as "TD".

For example, the low refractive index layer (TD) contains at least one compound selected from $ZrO_x$, SiC, $Si_3N_4$, $MgF_2$, $Al_2O_3$, $SiO_2$, and silicon-oxynitride. These are compounds with a relatively low refractive index. The low refractive index layer may also consist of the selected at least one compound.

According to an advantageous embodiment of the plate-shaped component according to the invention, the at least one low refractive index layer has a layer thickness of greater than 10 nm and less than 250 nm.

According to a further advantageous embodiment of the plate-shaped component according to the invention, the at least one color filter layer has a double layer comprising a high refractive index layer and a low refractive index layer.

According to a further advantageous embodiment of the plate-shaped component according to the invention, the at least one color filter layer has a triple layer, in which a high refractive index layer is arranged between two low refractive index layers, or a low refractive index layer is arranged between two high refractive index layers.

According to a further advantageous embodiment of the plate-shaped component according to the invention, the at least one color filter layer has a quadruple layer, in which two high refractive index layers and two low refractive index layers are arranged in alternating sequence, a high refractive index layer being arranged between two low refractive index layers and a low refractive index layer being arranged between two high refractive index layers.

According to a further advantageous embodiment of the plate-shaped component according to the invention, the at least one color filter layer is formed such that
- an electrical resistance at a voltage of 1000 V and a measuring electrode distance of 2 cm in daylight is not less than 10 GOhm, preferably not less than 100 GOhm, and
- a specific dark resistance is above $10^{10}$ Ωcm, preferably above $10^{11}$ Ωcm.

In the at least one structured region of the coloring cover plate, a reflection of the incident light radiation also occurs outside the gloss angle with relatively high intensity. For this purpose, the structured region is preferably designed in such a way that a reflection haze of more than 50%, particularly preferably more than 90%, is present. The reflectance haze can be determined by a commercially available haze meter. According to ASTM D1003, haze is the ratio of the diffuse component of the reflected light to the total reflection.

In the plate-shaped component according to the invention, at least one zone is to be provided in which the segments have an average roughness of less than 15% of the layer thickness of the color filter layer on the front surface, thus enabling constructive or destructive interference of the reflected light. Advantageously, this zone extends over the entire coloring cover plate. According to one embodiment, the structured region has at least one further zone, i.e. (partial-) region, in which the segments each have such a mean roughness that interference with the color filter layer does not occur. For example, the segments there have an average roughness of 50% to 100% of the layer thickness of the color filter layer. In these zones, the plate-shaped component does not have a color generated by the color filter layer.

The various embodiments of the invention may be implemented individually or in any combination. In particular, the features mentioned above and to be explained below can be used not only in the combinations indicated, but also in other combinations or alone, without leaving the scope of the present invention.

BRIEF DESCRIPTION OF THE DRAWINGS

The invention is explained in more detail below, with reference to the accompanying drawings. They show in simplified, not to scale representation:

FIGS. 1-4 schematic cross-sectional views of various embodiments of the plate-shaped component according to the invention;

FIGS. 11-14 schematic representations of exemplary light paths with reflection in the structured region of the coloring cover plate of FIG. 9;

FIGS. 16-17 schematic cross-sectional views of further embodiments of the coloring cover plate of the plate-shaped component according to the invention;

FIG. 18 a schematic illustration of exemplary light paths when reflected from the coloring cover plate;

FIG. 26 a schematic representation of the measurement procedure for multi-angle color measurement.

LIST OF REFERENCE SIGNS

Figure 5:
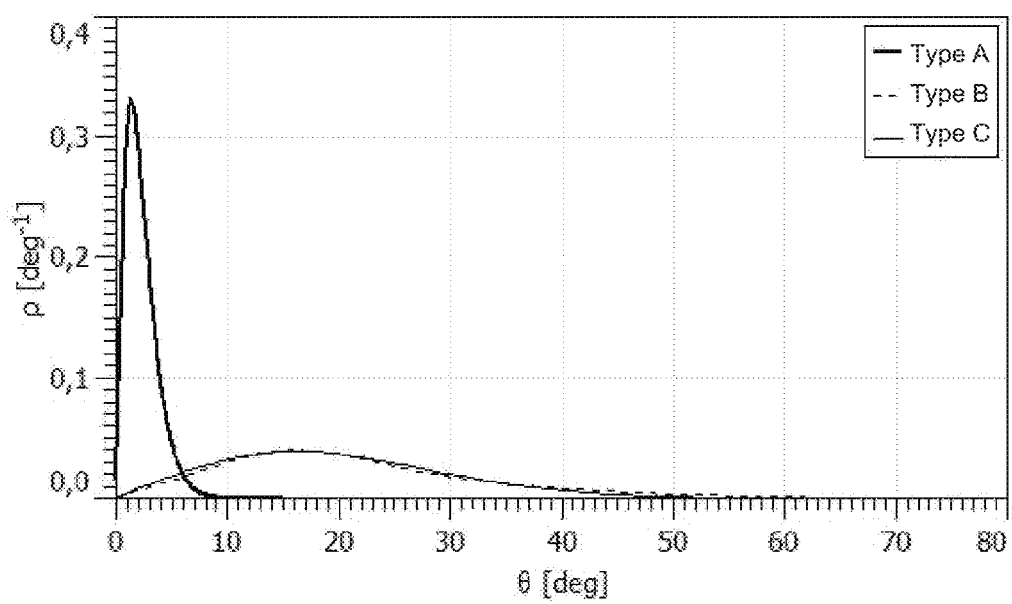
FIGS. 5-6 various diagrams for characterizing a front glass.

1 plate-shaped component
2 cover plate
3 mechanically supporting pane
4, 4' front surface
5, 5' back surface
6 adhesive layer
7 contact surface
8, 8' structured region
9, 9' color filter layer
10, 10' segment
11 first zone
12 second zone
13, 13' intermediate layer
14 back element
15, 15' composite pane
16 carrier substrate
17 multi-angle colorimeter
18 solar cells
19 masking layer
20 solar module
front V
back R
exterior environment U

DETAILED DESCRIPTION OF THE EMBODIMENTS

FIGS. 1 to 4 schematically illustrate various embodiments of a plate-shaped component designated overall by the reference number 1 on the basis of cross-sectional views (section perpendicular to the surface of the plate-shaped component). The plate-shaped component 1 is used, for example, for installation in a facade. The facade can be the outer skin of a building or the cladding of other structures such as noise barriers, screens, bridges or towers. The plate-shaped component can also be designed as a colored solar module that is mounted on roofs or open-area installations.

The plate-shaped component 1 comprises a transparent coloring cover plate 2 and a back element 14 which is firmly connected to the cover plate 2. The cover plate 2 is, for example, a glass pane and is made of a glass which preferably has a low absorption, such as soda-lime glass. The cover plate 2 is provided with at least one textured area and at least one color filter layer for coloring the plate-shaped component 1, as will be explained in detail below.

In the embodiment of FIG. 1, the plate-shaped component 1 is a photovoltaically active plate-shaped component 1 suitable and intended for generating energy from sunlight. The plate-shaped component 1 is in the form of a solar module 20. The plate-shaped component 1 comprises, in addition to the cover plate 2, a carrier substrate 16 (glass pane) which is, for example, glassy here and on which a plurality of serially connected solar cells 18 are formed. The carrier substrate 16 is firmly connected to the cover plate 2 by an intermediate layer 13 (e.g., by lamination). The cover plate 2 forms a composite pane 15 with the carrier substrate 16. The intermediate layer 13 is preferably a thermoplastic or crosslinking polymer intermediate layer (e.g., PVB or EVA). Preferably, the solar cells 18 are thin-film solar cells in which the photovoltaically active absorber layer consists of a chalcopyrite semiconductor, in particular a ternary I-III-VI compound semiconductor from the group copper indium/gallium disulfide/diselenide $(Cu(In,Ga)(S,Se)_2)$.

The plate-shaped component 1 has a front side V, which is to be viewed from the external environment (side of light incidence), and a back side R. For the purposes of the present invention, the external environment is considered to be the surrounding area U of the front side V of the plate-shaped component 1 (in FIGS. 1 to 4, respectively, the surrounding area located above the plate-shaped component 1).

The coloring cover plate 2 comprises a front surface 4 facing the external environment U and, opposite thereto, a back surface 5 facing away from the external environment U. For the purposes of the present invention, surfaces are referred to as "front surfaces" if they face the external environment U. Accordingly, surfaces are referred to as "back surfaces" if they face away from the external environment U.

FIG. 2 shows an embodiment in which the plate-shaped component 1 is a photovoltaically passive plate-shaped component 1. Here, the cover plate 2 is firmly connected to an opaque back element 14. The back element 14 is formed here, for example, as a full-surface coating of the back surface 5 of the cover plate 2. Similarly, the back element 14 can be formed, for example, in the form of a film, in particular an opaque film, which is firmly connected to the back surface 5 of the cover plate 2, or of a rigid body, in particular an opaque rigid body, for example in plate form.

FIG. 3 shows an embodiment in which the plate-shaped component 1 is a photovoltaically active plate-shaped component 1. The plate-shaped component 1 comprises a cover plate 2 and a mechanically supporting pane 3, which are firmly connected to each other by an intermediate layer 13 (e.g., by lamination). The cover plate 2 and the mechanically supporting pane 3 are, for example, glass panes and are made of a glass that preferably has a low absorption, such as soda-lime glass. This forms a composite pane 15. The two panes 2, 3 are preferably made of processed glass, such as thermally tempered glass, so-called toughened safety glass (ESG), or heat-strengthened glass (TVG), depending on the structural requirements.

The mechanically supporting pane 3 serves to mechanically support (i.e., reinforce) the coloring cover plate 2 and contributes significantly to the mechanical stability of the plate-shaped component 1 so that it can withstand even greater wind loads.

In the embodiment shown in FIG. 3, the coloring cover plate 2 is thinner than the mechanically supporting pane 3. For example, the cover plate has a pane thickness in the range of 2-4 mm.

The mechanically supporting pane 3 is thicker than the cover plate 2 and has, for example, a pane thickness of more than 4 mm.

The mechanically supporting pane 3 has a front surface 4' and a back surface 5'. The back surface 5' is firmly bonded (e.g., by lamination) to a carrier substrate 16 directly via a further intermediate layer 13', i.e., without an intermediate pane. The mechanically supporting pane 3 thus forms a further composite pane 15' with the carrier substrate 16. Overall, this results in a composite pane structure in which three panes are firmly connected to one another by lamination. The further intermediate layer 13' is preferably a thermoplastic or crosslinking polymer intermediate layer (e.g., PVB or EVA).

FIG. 4 shows a variant of FIG. 3, which differs from the design of FIG. 3 in that the mechanically supporting pane 3 is thinner than the cover plate 2. In addition, the mechanically supporting pane 3 is smaller than the cover plate 2 and corresponds in its dimensions to the carrier substrate 16. The mechanically supporting pane 3 is designed here in the form of a cover plate for the carrier substrate 16 with solar cells 18. During the production of the plate-shaped component 1, a solar module 20 comprising the mechanically supporting pane 3 as a cover plate and the carrier substrate 16 with solar cells 18 can be laminated to the cover plate 2. This can be advantageous from a process engineering point of view, since the solar module 20 can be prefabricated. The back element 14 then corresponds to the complete solar module 20. The size of the solar module 20 in the plane of the carrier substrate 16 is smaller than that of the cover plate 2, so that the solar module 20 is well protected against external influences. It would also be possible to form the cover plate 2 as the front glass of the solar module 20 (with correspondingly the same size as the carrier substrate 16), and then firmly connect the solar module 20 to the mechanically supporting second pane 3 arranged at the front.

In the embodiments of FIGS. 3 and 4, a masking layer 19 is arranged behind the last color filter layer (see below), i.e., behind the coloring cover plate 2. In FIGS. 3 and 4, the masking layer 19 is applied to the back surface 5 of the cover plate 2 in each case. The masking layer 19 covers the back surface 5 only partially, covering the photovoltaically inactive regions. The photovoltaically active regions of the solar cells 18 are not covered. This improves the external appearance of the plate-shaped component 1.

Depending on the embodiment of the plate-shaped component 1, the front surface 4 and/or the back surface 5 of the coloring cover plate 2 is structured (e.g., by etching, sandblasting or rolling during the drawing process) and has at least one color filter layer, which is not shown in FIGS. 1 to 4. This will be explained in more detail below.

Figure 9:
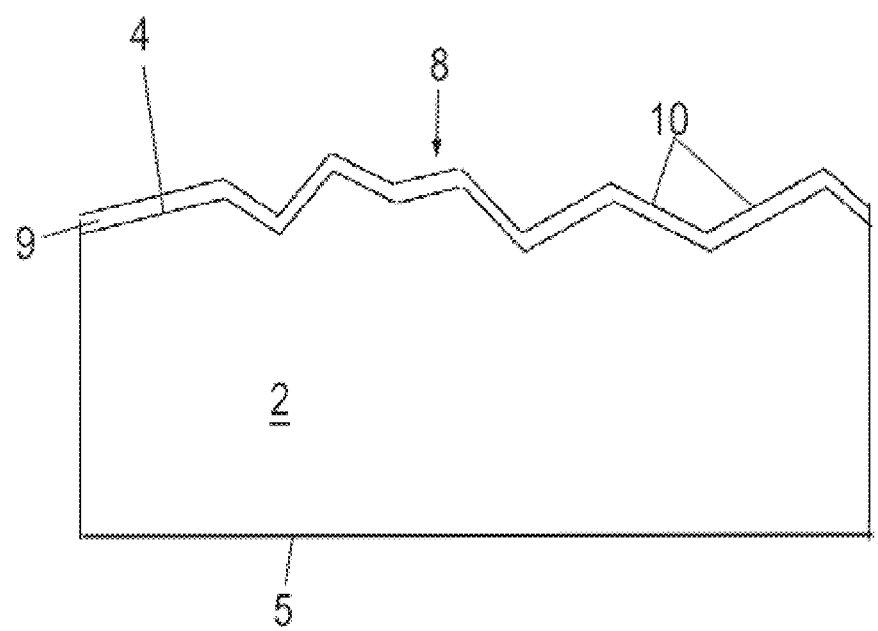
FIG. 9 a schematic cross-sectional view of the coloring cover plate according to one embodiment of the plate-shaped component according to the invention.

FIG. 9 illustrates an embodiment of the plate-shaped component 1 according to the invention, with only the coloring cover plate 2 being shown with an exemplary structuring. The plate-shaped component 1 can in particular be designed as shown in FIGS. 1 to 4. Accordingly, the front surface 4 of the coloring cover plate 2 is structured in a region 8 which, in the present example, extends over the entire front surface 4, i.e., the front surface 4 and structured region 8 are identical. A color filter layer 9 is arranged directly on the front surface 4. In the structured region 8, the front surface 4 is provided with a height profile which has mountains and valleys. Here, more than 50% of the front surface 4 consists of planar segments 10 whose planes are each inclined to the plane of the coloring cover plate 2, i.e., have a non-zero angle to the plane of the coloring cover plate 2. The segments 10 each have a segment area of at least 1 $\mu m^2$ and a mean roughness of less than 15% of the layer thickness d of the color filter layer 9. A mean height sublayer between the highest points (mountains) and lowest points (valleys) of the front surface 4 is at least 2 μm and, for example, at most 20% of the thickness of the coloring cover plate 2. With respect to the plane of the coloring cover plate 2, at least 20% of the segments have an angle of inclination in the range from greater than 0° to a maximum of 15°, at least 30% of the segments have an angle of inclination in the range from greater than 15° to a maximum of 45°, and less than 30% of the segments 10 have an angle of inclination greater than 45°. In the embodiment example of FIG. 9, all segments have an angle of inclination of maximum 45°.

Figure 10:
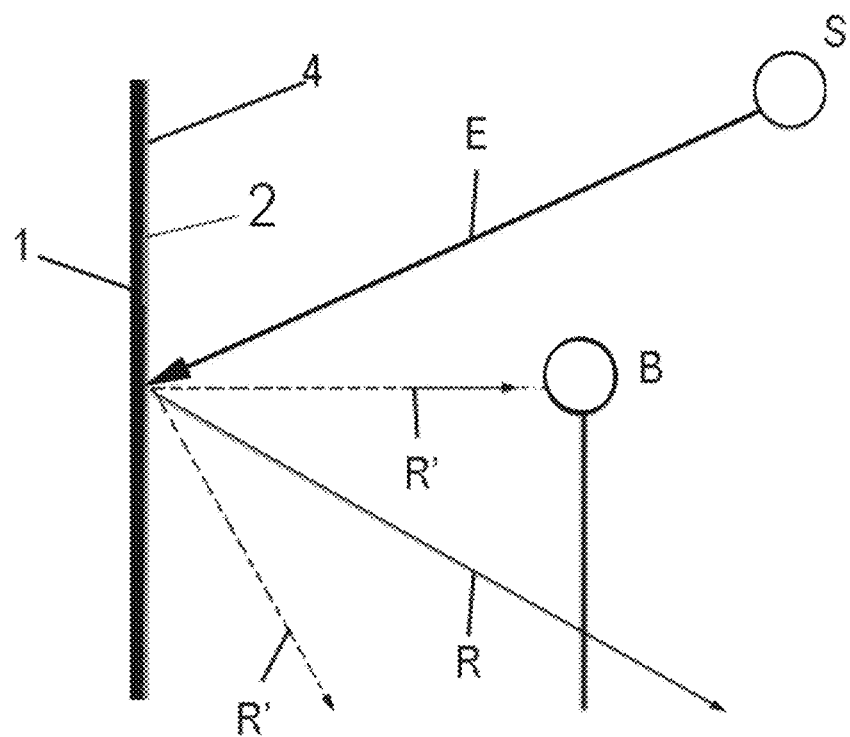
FIG. 10 a schematic representation of typical light conditions on a plate-shaped component according to the invention.

The mode of operation of the structuring of the front surface 4 of the coloring cover plate 2 is described in more detail below. Let us first look at FIG. 10, in which typical light conditions for a plate-shaped component 1 are illustrated by way of example. Accordingly, light from the sun S strikes the coloring cover plate 2 directly and is reflected at a gloss angle. The incident light beam E and the light beam R reflected at the gloss angle are shown. In addition to the reflected light beam R, the incident light is also diffusely scattered outside the gloss angle. Two diffusely scattered light beams R' are shown as examples. The color effect is caused by reflection, scattering and interference. If an observer B stands in front of the plate-shaped component 1 (for example a facade) and looks perpendicularly at the coloring cover plate 2 in front of him, his eye only rarely meets the directly reflected light R (i.e., the observer is usually not standing at the gloss angle). This is illustrated in FIG. 10, where the observer B is outside the gloss angle and sees only the diffusely scattered light beam R'. For a smooth surface without a structured region 8, the intensity of the diffusely scattered light R' is relatively low and shows a strong angular dependence. Only when the diffusely scattered portion is sufficiently large is there a clear color with satisfactory intensity (brightness, L value).

The basic principle of operation of the inclined segments 10 of the structured region 8 is illustrated in FIG. 11, in which the various light paths are shown by way of example for an observer B looking perpendicularly at the glass surface or front surface 4 of the plate-shaped component 1. Shown are three segments 10 with different inclinations to the schematically illustrated plane GE of the coloring cover plate 2, as well as the light rays E incident on the segments 10, which are reflected by the segments 10 in each case at the local gloss angle to the observer B (reflected light rays R). The middle segment 10 is arranged parallel to the plane GE, with the incident light beam E striking the segment 10 perpendicularly and being reflected perpendicularly to the observer B (reflected beam R). For the middle segment 10, the gloss angle and local gloss angle are identical. For the two adjacent segments 10, the incident light rays E each have a non-zero angle to the surface normal to the plane GE and also strike the observer B at the local gloss angle. Due to the different inclinations of the segments 10, light from different directions is reflected in each case at the local gloss angle of the segments 10 to the observer B looking perpendicularly at the module surface. In the example of FIG. 11, the angle of incidence and angle of reflection are at most 45°.

FIG. 12 shows a situation in which the observer B looks at the plane GE of the coloring cover plate 2 at an angle of 45° to the surface normal. As in FIG. 11, three segments 10 with different inclinations to the plane GE of the coloring cover plate 2 are shown as an example, as well as the light rays E hitting the segments 10 in each case, which are reflected by the segments 10 at the local gloss angle to the observer B (reflected light rays R). Due to the different inclinations of the segments 10, light from different directions is reflected in each case at the local gloss angle to the observer B looking at the module surface. In the embodiment example of FIG. 12, the angle of incidence and angle of reflection amount to a maximum of 67.5°. In principle, the reflected light is blue-shifted at relatively large values of the gloss angle. This blue shift can be reduced by a higher refractive index of the color filter layer. With relatively steep surface inclinations, multiple reflection at neighboring facets can also occur.

Figure 13:
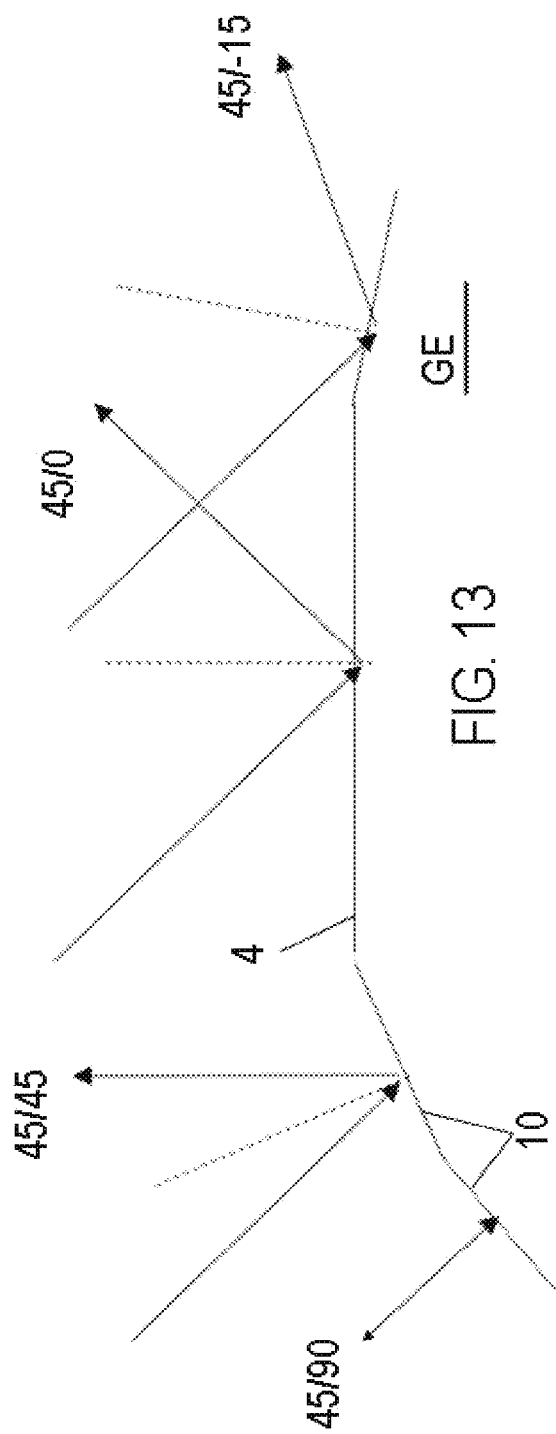

FIG. 13 shows a situation in which the light source and, accordingly, the incident light rays are always inclined at an angle of 45° to the plane GE of the coloring cover plate 2. The observer B views the surface of the plate-shaped component 1 at various angles. The angular indications in FIG. 13 are to be understood as follows: Angle of incidence (referred to plane GE of the coloring cover plate 2)/Angle of observation or reflection (deviation from the gloss angle referred to surface normal on plane GE). The degree sign is not indicated. FIG. 13 shows an example of four segments 10 with different inclinations to the plane GE. Only in one segment 10, the plane of which is parallel to the plane of the coloring cover plate 2, the observer B is located in the gloss angle with respect to the plane GE: 45/0. This means that the incident light beam has an angle of 45° to the plane GE, the reflected light beam has an angular deviation of zero from the gloss angle. For the other segments 10, the observer B is outside the gloss angle. For the two left segments 10 (45/90, 45/45), the observer views the surface of the plate-shaped component 1 at an angle of 90° and 45° to the gloss angle, respectively, with the light incident at an angle of 45° to the plane GE. In the case of the right segment 17 (45/−15), the observer is at an angle of −15° to the gloss angle. Due to the differently inclined segments 10 and the resulting reflection at the local gloss angle, light is reflected with sufficient intensity to the observer B even if the observer is not located at the gloss angle, relative to the plane GE of the coloring cover plate 2

Figure 14:
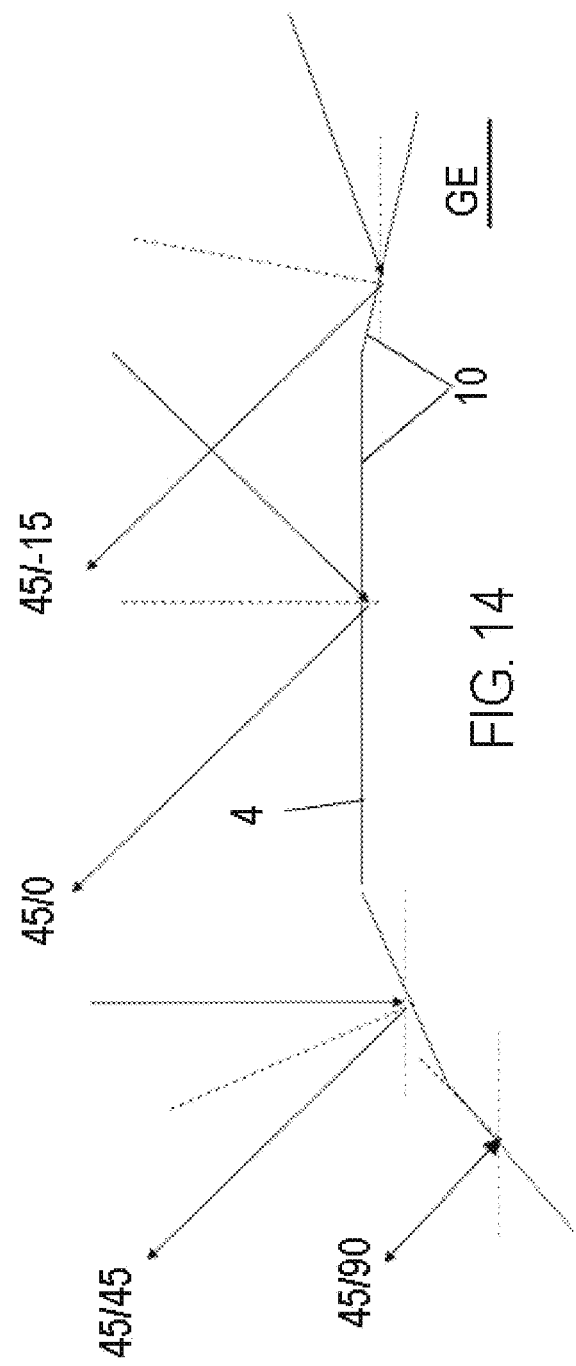

FIG. 14 shows a situation in which the observer B always observes the surface of the plate-shaped component 1 at an angle of 45° to the module surface or plane GE of the coloring cover plate 2. In FIG. 14, four segments 10 with different inclinations to the plane GE are shown as examples. Only in one segment 10, whose plane is parallel to the plane GE, is the observer B located at the gloss angle: 45/0. In the other segments 10, the observer B is located outside the gloss angle. For the two left segments 10 (45/90, 45/45), the observer B is looking at the surface of the plate-shaped component 1 at an angle of 45°, with the light incident at a deviation of 90° and 45°, respectively, relative to the gloss angle. In the case of the right segment 10 (45/−15), the light is incident at an angle of −15° relative to the gloss angle. Due to the differently inclined segments 10 and the resulting reflection at the local gloss angle, light is reflected to observer B with sufficient intensity even if light is incident outside the gloss angle.

In the plate-shaped component 1 according to the invention, the structuring of the front surface 4 of the coloring cover plate 2 in combination with the coloring color filter layer 9 makes it possible to achieve a homogeneous color impression in a predeterminable wavelength range, whereby the color impression is much less dependent on the angle compared to a non-structured surface.

Figure 15:
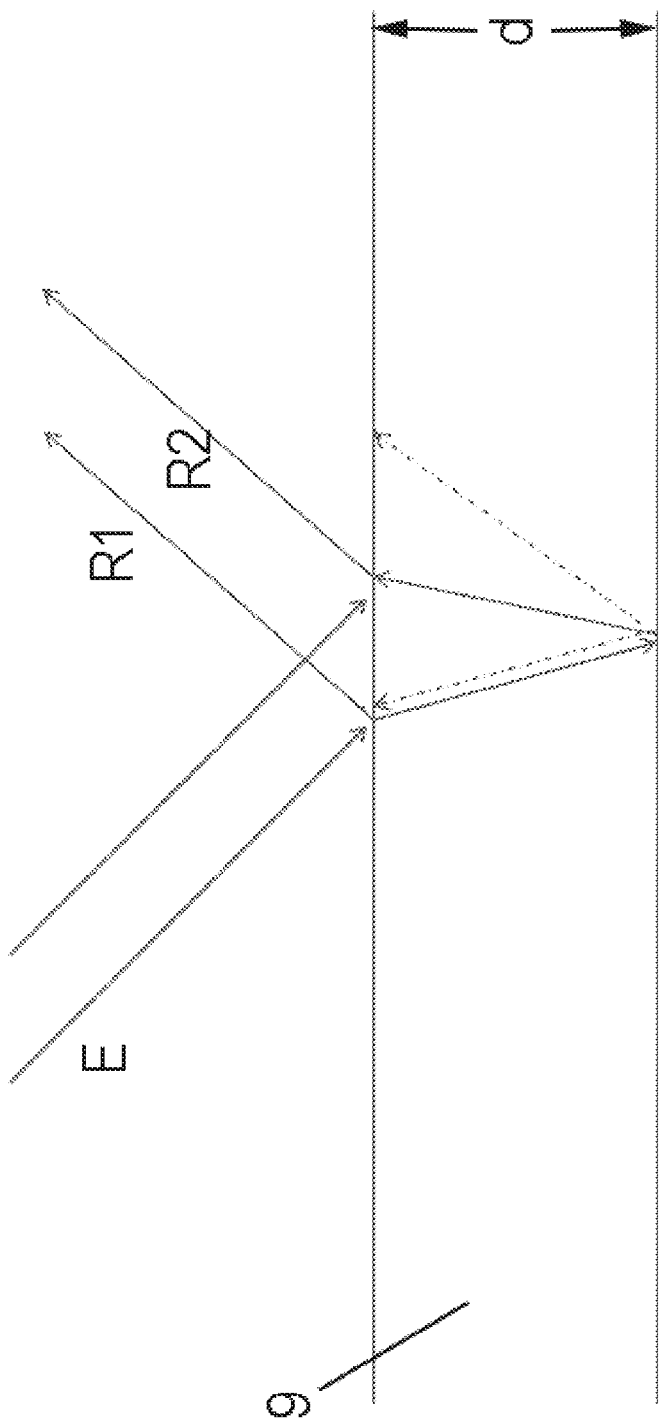
FIG. 15 a schematic representation of the interference of light rays in a color filter layer.

FIG. 15 illustrates the reflection at the color filter layer 9 with layer thickness d. The incident light beam E is reflected both at the atmosphere-color filter layer interface (R1) and at the color filter layer-disk interface (R2). If the path difference of the two light beams R1, R2 corresponds to a multiple of the wavelength of the incident light beam, constructive interference occurs; if the path difference is a multiple of half the wavelength, destructive interference occurs. When illuminated with white light, the color filter layer 9 thus acts as a color filter, since constructive interference, depending on the refractive index n and layer thickness d, occurs only for light of suitable wavelength. Here α is the angle of the reflected rays R1, R2, to the surface normal. The light rays R' exemplify the reflected light outside the gloss angle, which may occur in the patterned region 15 if the roughness of the color filter layer-pane interface is too high. In order to satisfy the interference condition, it is necessary for the scattering centers to be smaller than the wavelength and layer thickness, respectively. This can be achieved by the minimum area of the segments claimed in the invention and their maximum roughness. However, coloring is also possible if the layer thickness is significantly smaller than the wavelength, for example due to the dispersion of the refractive index (dependence of the refractive index on the wavelength) and due to partial absorption of the highly refractive materials used according to the invention in a part of the visible spectrum. The roughness conditions should also be fulfilled for these very thin layers.

If the front surface 4 of the coloring cover plate 2 is coated with a color filter layer 9 consisting of an inorganic, chemically inert and hard layer such as with $Si_3N_4$, for example, this results in a high scratch resistance, chemical resistance and dirt-repellent effect for the plate-shaped component 1. The use of photocatalytic layers such as $TiO_2$ can also result in a self-cleaning effect. Climatic tests have also shown that color filter layers made of materials such as $Si_3N_4$ or $TiO_2$ also prevent corrosion of a glass cover plate 2 by moist heat.

Figure 16:
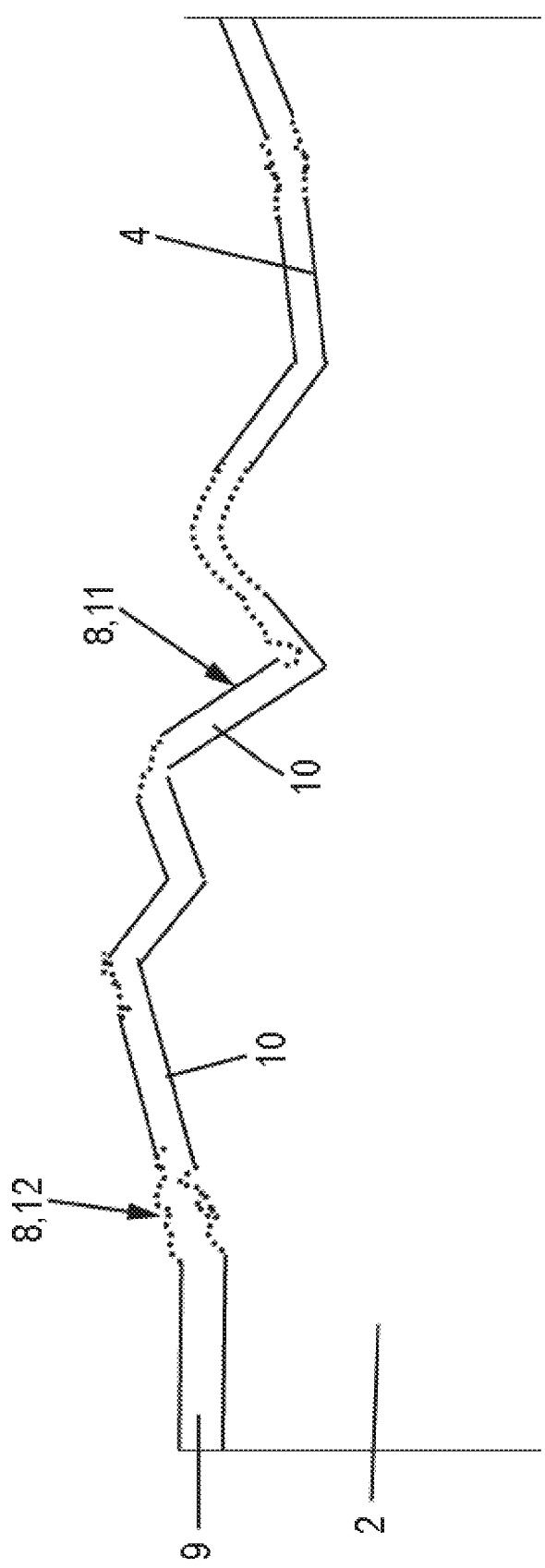

Reference is now made to FIG. 16, in which a further embodiment of the plate-shaped component 1 according to the invention is illustrated, again with only the coloring cover plate 2 shown. To avoid unnecessary repetition, only the differences from FIG. 9 are described and otherwise reference is made to the above explanations. In this embodiment, the structured region 8 of the front surface 4 has first zones 11 and second zones 12. Here, the first zones 11 are formed such that the segments 10 have an average roughness that is less than 15% of the layer thickness d of the color filter layer 9 on the front surface 4. In the embodiment of FIG. 9, this applies to the entire structured region 8. In contrast, the average roughness in the second zones 12 is such that interference in the color filter layer 9 is prevented. For example, the average roughness of the segments 10 in the second zones 12 is more than 50% of the layer thickness of the color filter layer 9. The plate-shaped component 1 therefore has a homogeneous color in the first zones 11, which results from the color filter effect of the color filter layer 9. In the second zones 12, the color filter layer 9 has no color filter effect due to a lack of constructive interference, and thus there is essentially a surface corresponding to the plate-shaped component without color filter layer 9. The plate-shaped component 1 can thus be provided with a homogeneous color in the pre-definable first zones 11 as desired. In FIG. 16, the second zones 12 are schematically illustrated by a greater roughness.

FIG. 17 illustrates a further embodiment of the plate-shaped component 1 according to the invention, in which only the coloring cover plate 2 is shown. In order to avoid unnecessary repetition, only the differences from the embodiment of FIG. 9 are described and otherwise reference is made to the above explanations. Accordingly, the plate-shaped component 1 has a first color filter layer 9 on the front surface 4 of the coloring cover plate 2 on the structured region 8 and a second color filter layer 9' on the back surface 5 of the coloring cover plate 2. The back surface 5 of the coloring cover plate 2 is not structured, i.e., does not have a structured region 8 analogous to the front surface 4. The back surface 5 is smooth within the limits of the production inaccuracies. The second color filter layer 9' has a layer thickness d' and an optical refractive index n' which may be the same as those of the first color filter layer 9, but need not necessarily be the same. The second color filter layer 9' further enhances the color effect. With reference to the embodiment of FIG. 9, this provides a second reflection source with a color filter effect, since the refractive index of the second color filter layer 9' between the coloring cover plate 2 (e.g., glass) and the adhesive layer 6 is greater than that of the coloring first pane 2 (e.g., glass) and the adhesive layer 6. As a result of the light refraction, the angle of incidence at the second reflection is smaller. Since the light passes through a color filter layer three times in total, the light reaching the observer is more filtered. In particular, the coating thicknesses d, d' and the refractive indices n, n' of the two color filter layers 9, 9' can also be significantly different from each other. In the case of coatings with significantly different optical thicknesses n*d or n'* d', mixed colors can be generated, since the first color filter layer 9 then generates a different reflection spectrum than the second color filter layer 9' and the light reflected by the second color filter layer 9' is superimposed when it passes the first color filter layer 9 again. In this way, colored plate-shaped components 1 with a variety of colors and high angular stability for colored solar modules and colored active and passive facade elements can be produced in a very simple and cost-effective manner.

FIG. 18 shows a highly simplified illustration of the beam path of incident light E and reflected light R1, R2. FIG. 18 does not show the structuring of the coloring cover plate 2. Only a single beam path is shown, here in the gloss angle relative to the plane of the coloring cover plate 2. It can be seen that the light that has passed through the first color filter layer 9 is refracted in the coloring cover plate 2 (e.g., glass), is reflected a second time at the second color filter layer 9' and is filtered by interference. When it leaves the coloring cover plate 2, it passes the color filter layer 9, so that the color filter layers are passed three times.

Figure 19:
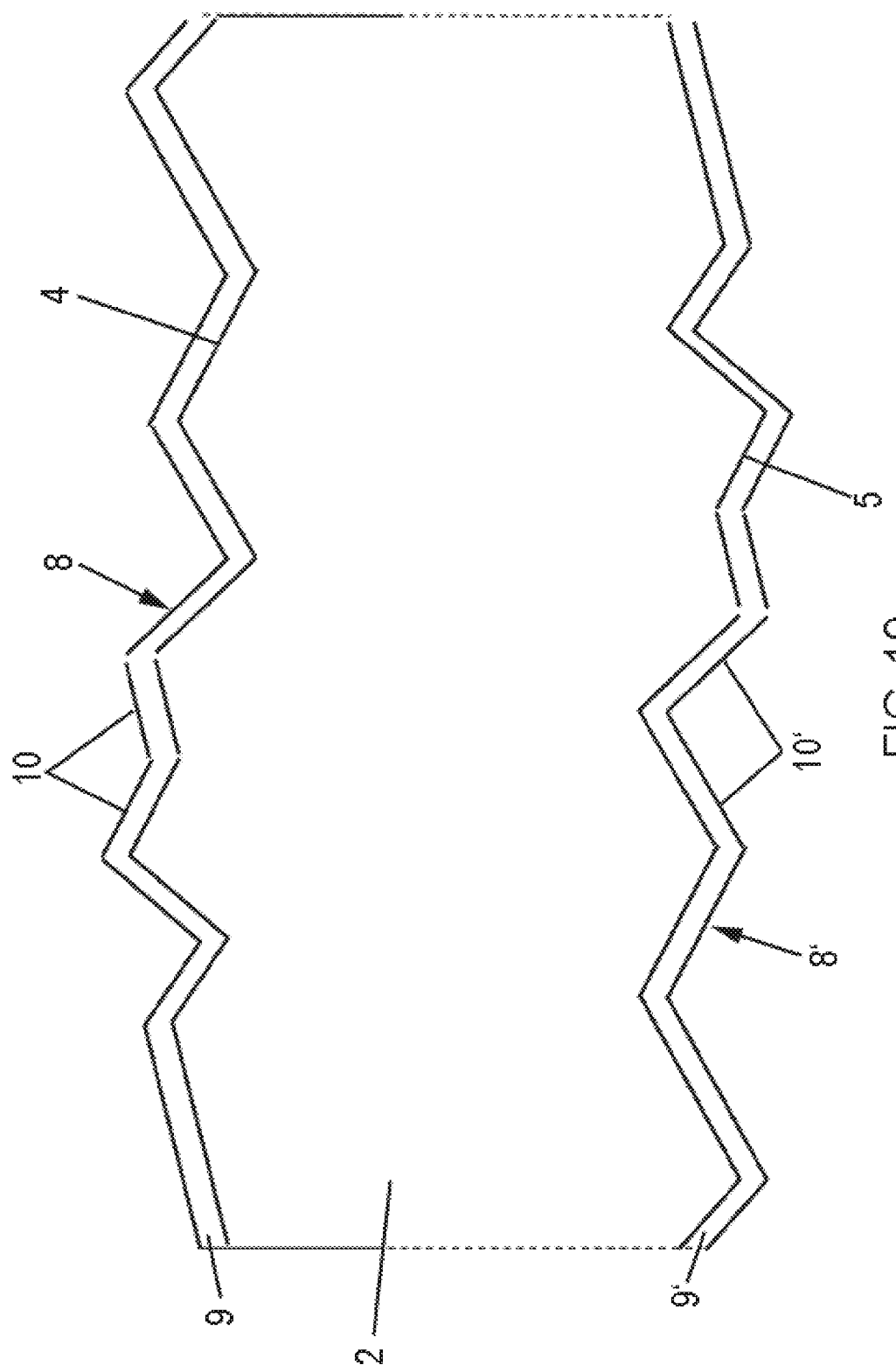
FIGS. 19-20 further embodiments of the coloring cover plate of the plate-shaped component according to the invention in schematic cross-sectional views.

FIG. 19 illustrates a further embodiment of the plate-shaped component 1 according to the invention, in which only the coloring cover plate 2 is shown. To avoid unnecessary repetition, only the differences are described and otherwise reference is made to the above explanations.

Accordingly, the plate-shaped component 1 has a first structured region 8 on the front surface 4 of the coloring cover plate 2 and a second structured region 8' on the back surface 5 of the coloring cover plate 2, wherein a first color filter layer 9 is arranged on the first structured region 8 and a second color filter layer 9' is arranged on the second structured region 8'. The two structured regions 8, 8' can be of the same or different design. Likewise, the two color filter layers 9, 9' can be formed identically or differently, whereby in particular the layer thicknesses d, d' and the refractive indices n, n' of the two color filter layers 9, 9' can be different from one another. If an equal optical thickness n*d is selected for the two color filter layers 9, 9', the color of the plate-shaped component 1 can be enhanced. When coating with significantly different optical thicknesses, mixed colors can be generated.

These designs have in common that already when the light hits the structured front surface with color filter layer, a color with high intensity and low angular dependence is created by reflection and interference even outside the gloss angle. The additional color filter layers and/or structuring on the back surface can further enhance this effect.

Figure 20:
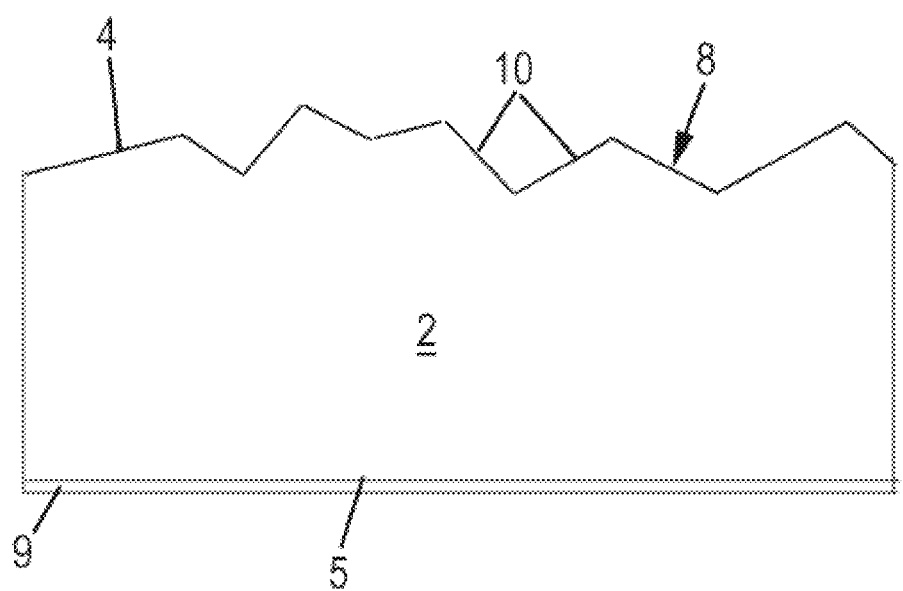

FIG. 20 illustrates a further embodiment of the plate-shaped component 1 according to the invention by means of an enlarged section of the coloring cover plate 2 of the plate-shaped component 1. In order to avoid unnecessary repetition, only the differences are described and otherwise reference is made to the above explanations. Accordingly, the front surface 4 of the coloring cover plate 2 is structured in a region 8 which, in the present example, extends over the entire front surface 4, i.e., the front surface 4 and structured region 8 are identical. A color filter layer 9 is arranged directly on the back surface 5 of the coloring cover plate 2.

The back surface 5 has no structuring and is smooth within the limits of production inaccuracies. There is no color filter layer on the front surface 4. There is no roughness condition for the segments 10 of the structured region 8 of the front surface 4 of the plate-shaped component 1 of FIG. 20.

Figure 21:
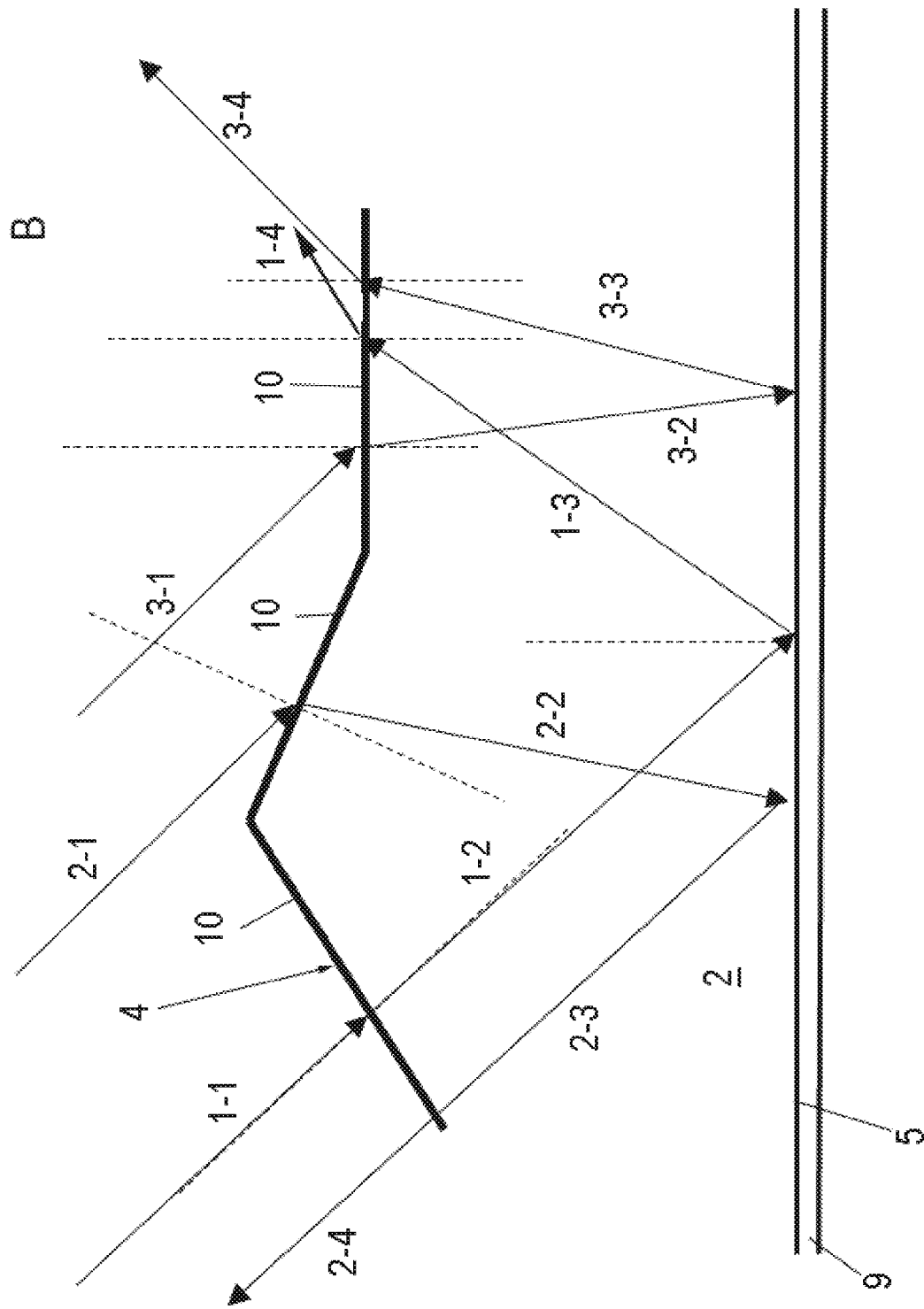
FIG. 21 a schematic representation of exemplary light paths upon reflection in the structured region of the plate-shaped component of FIG. 20.

FIG. 21 illustrates in more detail the function of the structured front surface 4 in combination with the internal color filter layer 9 as shown in FIG. 20. Shown therein are examples of various light paths for differently inclined segments 10 of the coloring cover plate 2. Three segments 10 are shown by way of example, with the right segment 10 lying parallel to the plane of the coloring cover plate 2 and the other two segments 10 having a non-zero angle to the plane of the coloring cover plate 2. The reflection of the light rays from the color filter layer 9 is shown in simplified form. The reflection at the color filter layer 9 has already been explained. In FIG. 21, the light paths for three light beams are shown, each of which strikes the differently inclined segments 10 of the front surface 4 of the coloring cover plate 2 at the same angle to the normal to the plane of the coloring cover plate 2. The respective perpendicular to the segments 10 is drawn in dashed lines. Due to the differently inclined segments 10, the light rays are reflected in different ways. A first light beam 1-1 hits a segment 10, crosses the coloring cover plate 2 as a refracted light beam 1-2, is reflected by the color filter layer 9 (at the gloss angle) as a light beam 1-3, and emerges from the coloring cover plate 2 to the outer environment as a refracted light beam 1-4. The light beam 1-4 ultimately reflected from the coloring cover plate 2 has a different angle to the normal to the plane of the coloring cover plate 2 than the incident light beam 1-1, so that there is no reflection at the gloss angle but scattering. In a corresponding manner, a second light beam 2-1 impinges on another segment 10, crosses the coloring cover plate 2 as a refracted light beam 2-2, is reflected by the color filter layer 9 as a light beam 2-3, and emerges from the coloring cover plate 2 toward the external environment as a refracted light beam 2-4. The reflected light beam 2-4 emerges from the coloring cover plate 2 approximately opposite to the direction of incidence of the light beam 2-1, which is also a scattering process and not a reflection at the gloss angle. A third light beam 3-1 impinges on another segment 10, crosses the coloring cover plate 2 as a refracted light beam 3-2, is reflected by the color filter layer 9 as a light beam 3-3, and emerges from the coloring cover plate 2 toward the outer environment as a refracted light beam 3-4. This segment 10 is parallel to the plane of the coloring cover plate 2, so that the light beam 2-4 is reflected at the gloss angle. It is essential here that, due to the refraction at the respective segment 10 and subsequent reflection at the interface with color filter layer 9 and further refraction at the structured surface, a strong reflection occurs overall even outside the gloss angle (relative to the plane of the coloring cover plate 2) through those segments 10 which are inclined to the plane of the coloring cover plate 2, so that a homogeneous color effect of the reflected light is achieved in combination with the color filter layer 9. FIG. 21 shows an example of the position of a viewer B who is located outside the gloss angle. Due to the relatively strongly (diffusely) scattering coloring cover plate 2 with external structuring and internal color filter layer, suitable light paths are usually found for different viewing angles outside the gloss angle, which have passed through the color filter layer. This results in a color impression that is much less direction-dependent than with conventional modules without structured region 8.

Figure 22:
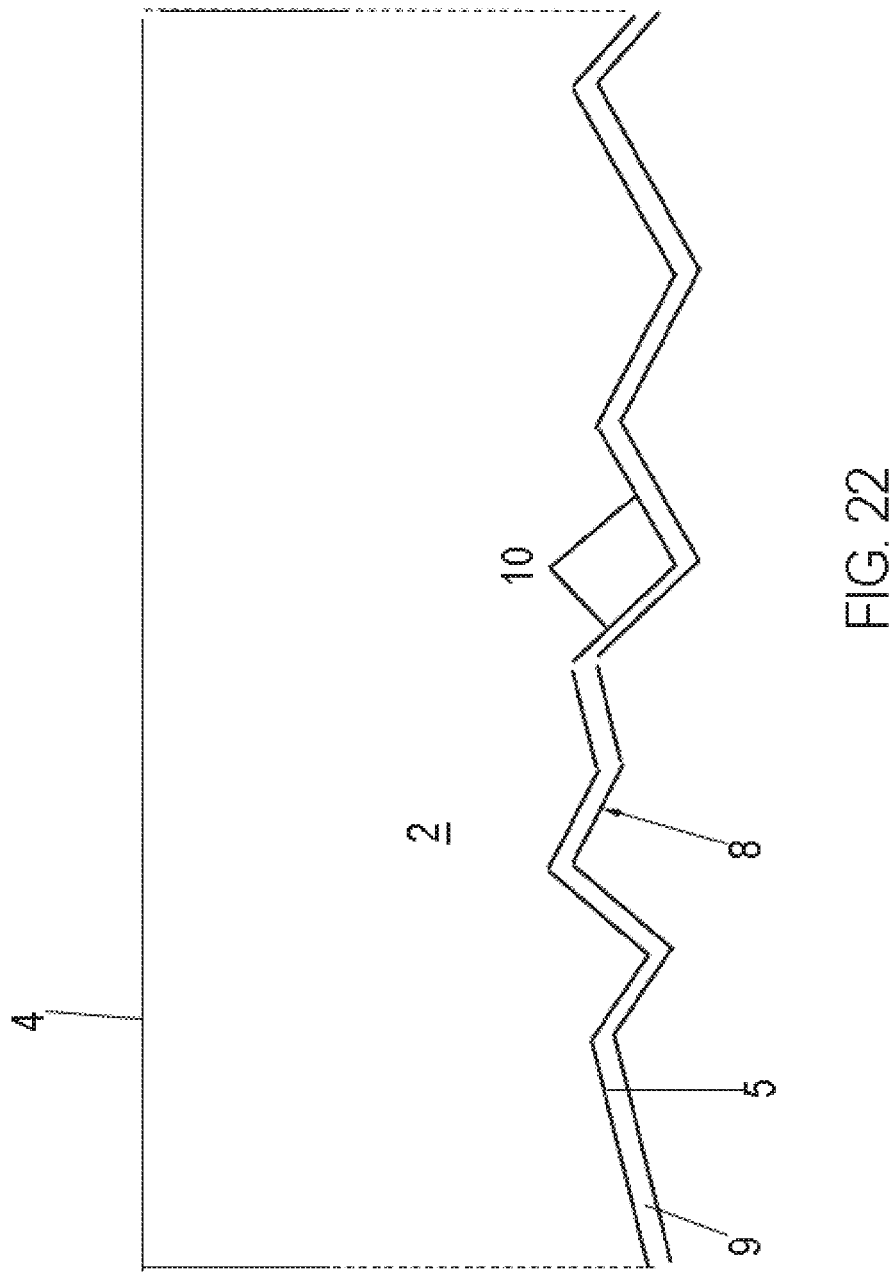
FIG. 22 a further embodiment of the coloring cover plate of the plate-shaped component according to the invention in a schematic cross-sectional view.

Reference is now made to FIG. 22, in which a further embodiment of the plate-shaped component 1 according to the invention is illustrated, with only the coloring cover plate 2 being shown. In order to avoid unnecessary repetition, only the differences are described and otherwise reference is made to the above explanations. Accordingly, the plate-shaped component 1 has a structured region 8 on the back surface 5 of the coloring cover plate 2, wherein a color filter layer 9 is arranged on the structured region 8. The color filter layer 9 is thin and follows the surface of the structured region 8. The structured region 8 and the color filter layer 9 may each be formed analogously to the previous embodiments. The front surface 4 of the coloring cover plate 2 does not have a structured region 8 and is smooth within production inaccuracies. Furthermore, no color filter layer is arranged on the front surface 4. Unlike the segments 10 of the structured region 8 of the front surface 4, the color filter layer 9 is provided on the structured region 8 of the back surface 5, so that the segments 10 have to satisfy the condition that the segments 10 of the structured region 8 of the back surface 5 are each planar, have a segment area of at least 1 μm$^2$, and have an average roughness of less than 15% of a layer thickness of the color filter layer 9 on the back surface 5.

Figure 23:
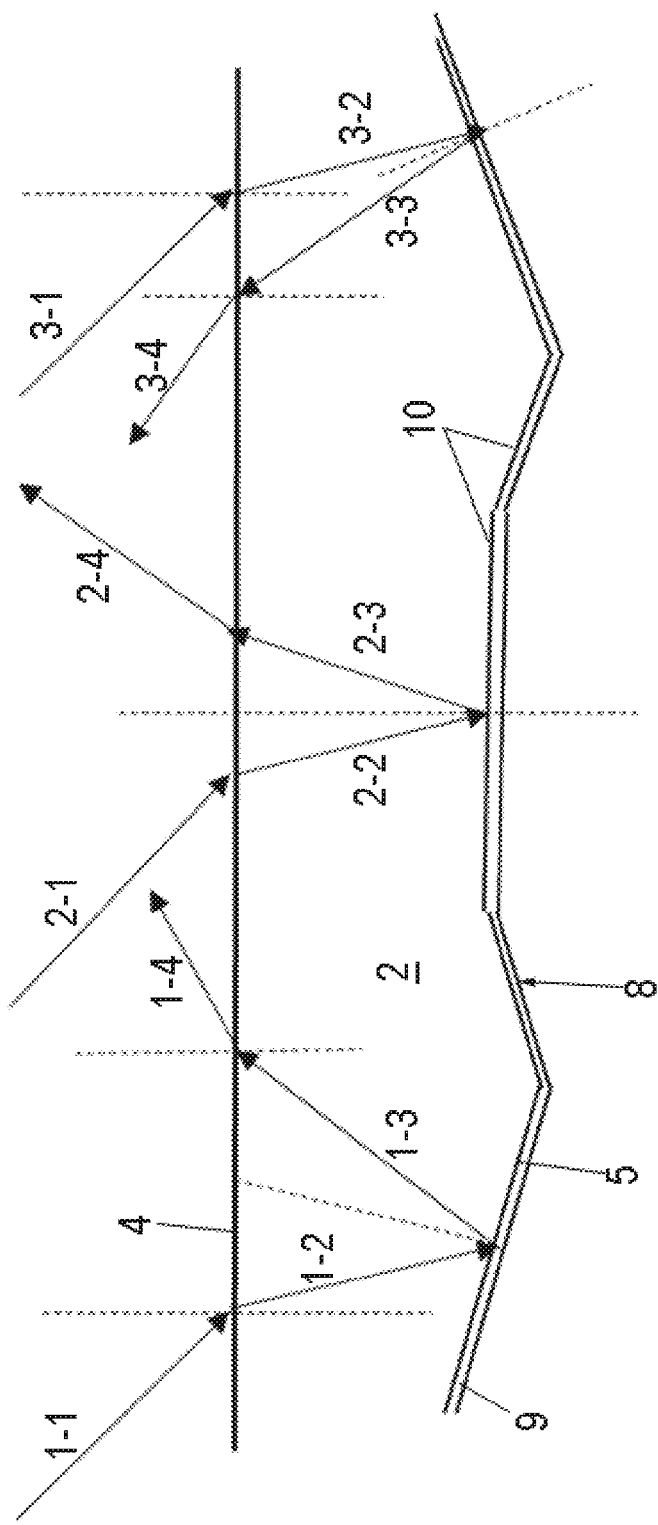
FIG. 23 a schematic illustration of exemplary light paths when reflected from the coloring cover plate of the plate-shaped component of FIG. 22.

FIG. 23 shows three different light paths as examples. The reflection of the light rays at the color filter layer 9 is again shown in simplified form. Due to the differently inclined segments 10, the light rays are reflected differently from the coloring cover plate 2. A first light beam 1-1 strikes the front surface 4 of the coloring cover plate 2, crosses the coloring cover plate 2 as a refracted light beam 1-2, is reflected as a light beam 1-3 from a segment 10 inclined to the plane of the coloring cover plate 2, and emerges as a refracted light beam 1-4 from the coloring cover plate 2 toward the outer environment. In a corresponding manner, a second light beam 2-1 impinges on the front surface 4 of the coloring cover plate 2, traverses the coloring cover plate 2 as a refracted light beam 2-2, is reflected as a light beam 2-3 from a segment 10 parallel to the plane of the coloring cover plate 2, and emerges as a refracted light beam 2-4 from the coloring cover plate 2 toward the external environment. In a corresponding manner, a third light beam 3-1 strikes the front surface 4 of the coloring cover plate 2, traverses the coloring cover plate 2 as a refracted light beam 3-2, is reflected as a light beam 3-3 by a segment 10 inclined to the plane of the coloring cover plate 2, and emerges as a refracted light beam 3-4 from the coloring cover plate 2 toward the external environment. Only for the middle segment 10 is the condition incident angle=reflection angle, i.e., reflection at the gloss angle, fulfilled for the incident light beam 2-1 and outgoing light beam 2-4. The other light beams are reflected by the segments 10 in each case at the local gloss angle, which, however, does not correspond to the gloss angle of the plane of the coloring cover plate 2, so that relatively strong scattering occurs. In conjunction with the color filter layer 9, a homogeneous color effect for the plate-shaped component 1 which is not very direction-dependent can be achieved.

Figure 24:
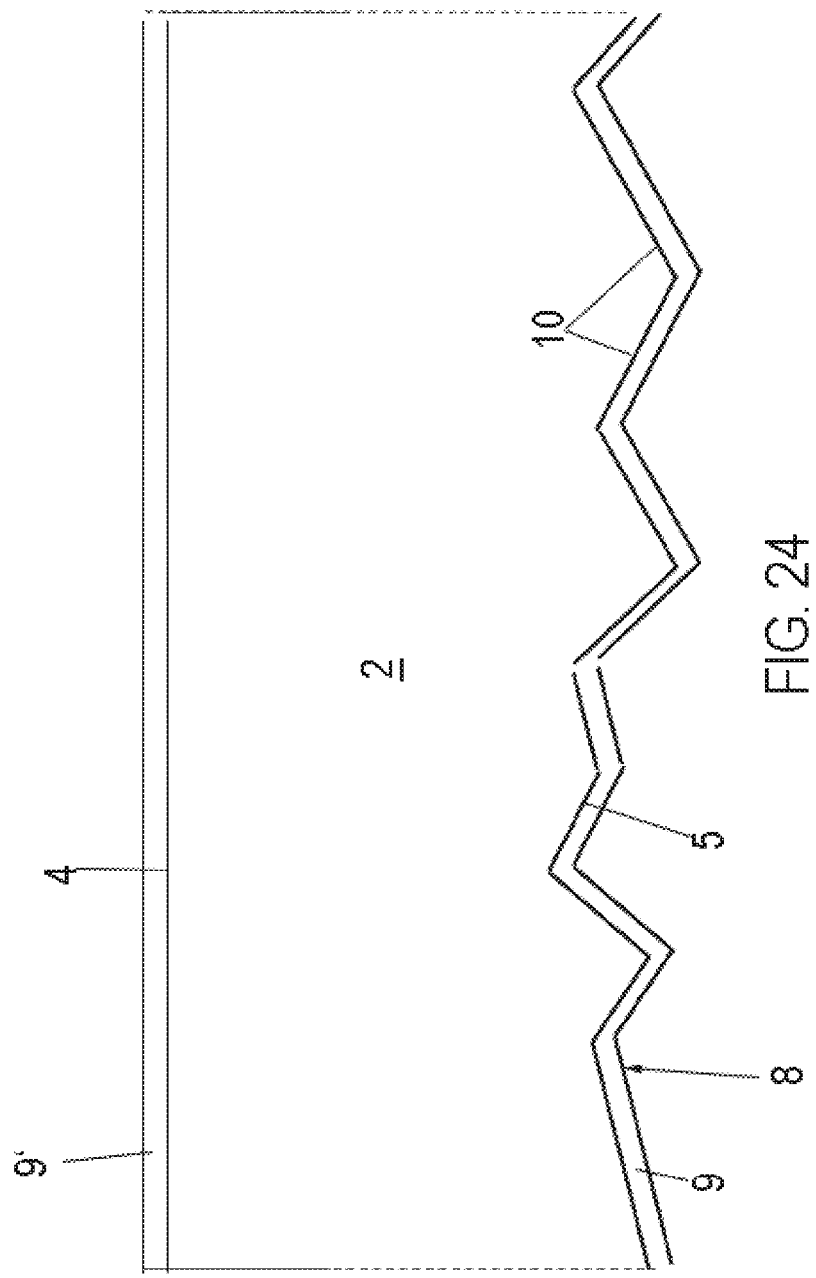
FIGS. 24-25 further embodiments of the coloring cover plate of the plate-shaped component according to the invention in schematic cross-sectional views.

FIG. 24 illustrates a further embodiment of the plate-shaped component 1 according to the invention, with only the coloring cover plate 2 being shown. To avoid unnecessary repetition, only the differences are described and otherwise reference is made to the above explanations. Accordingly, the plate-shaped component 1 has, in addition to the color filter layer 9 on the structured region 8 of the back surface 5 of the coloring cover plate 2, a further color filter layer 9' directly on the front surface 4 of the coloring cover plate 2. The front surface 4 is not structured, i.e., does not have a structured region 8 analogous to the back surface 5.

Rather, the front surface 4 is smooth within the limits of production inaccuracies. The two color filter layers 9, 9' may have the same or different optical refractive index and the same or different layer thickness. If an equal optical thickness n*d is selected for the two color filter layers 9, 9', the color of the plate-shaped component 1 can be enhanced because the light reaching the observer passes through a color filter layer three times in total and is therefore more filtered. In the case of coatings with significantly different optical thicknesses, mixed colors can be generated.

If the front surface 4 of the coloring cover plate 2 is coated with a color filter layer 9' consisting of an inorganic, chemically inert and hard layer such as $Si_3N_4$, for example, a high scratch resistance, chemical resistance and dirt-repellent effect is obtained for the plate-shaped component 1. The use of photocatalytic layers such as $TiO_2$ can also result in a self-cleaning effect.

Such an additional layer disposed on the front surface 4 may also be a thin anti-reflective layer having an optical refractive index smaller than that of the coloring cover plate 2, thereby suppressing the substantially white reflection of the coloring cover plate 2 (e.g., glass) and increasing the degree of saturation of the colors.

Figure 25:
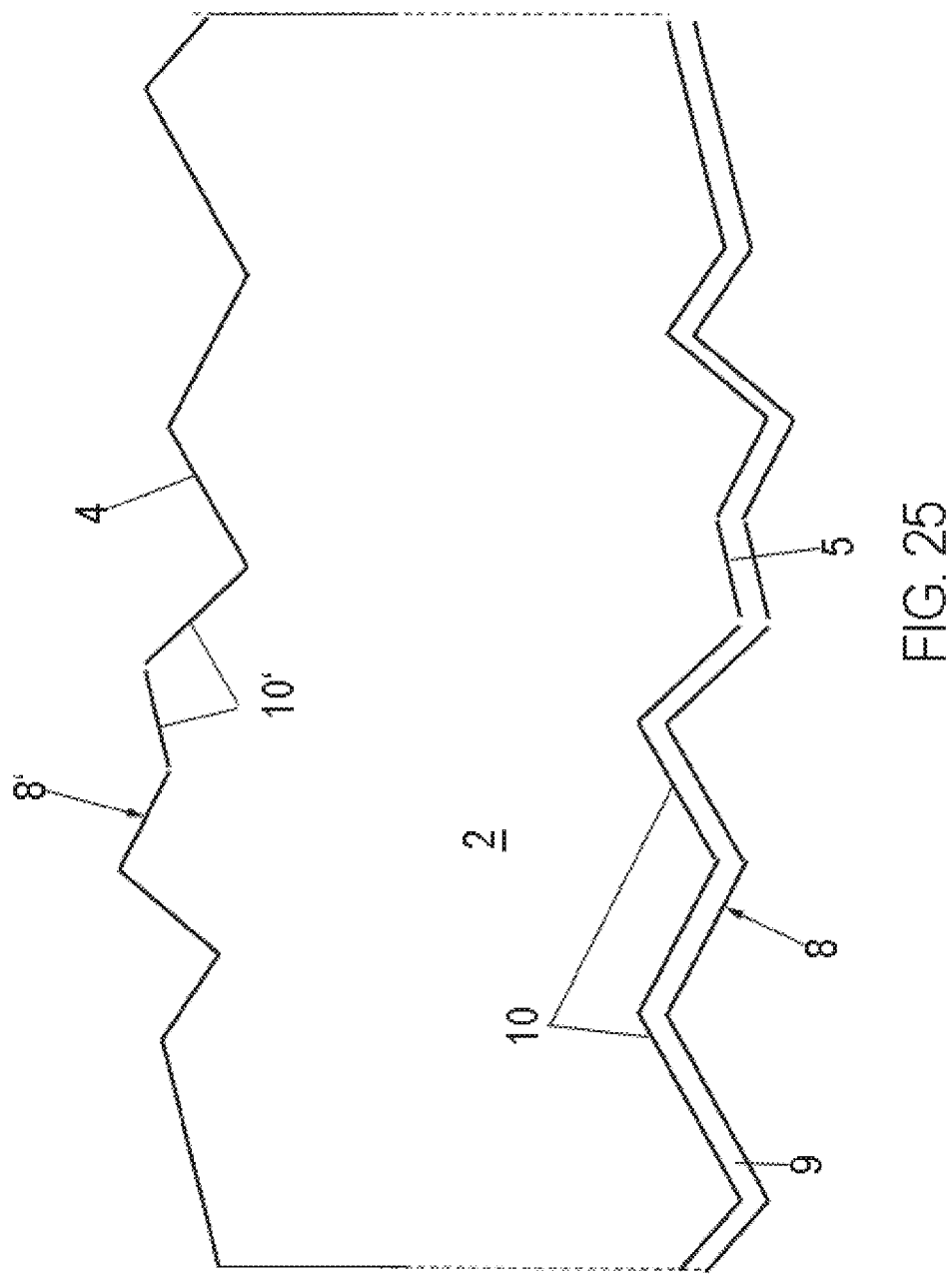

FIG. 25 illustrates a further embodiment of the plate-shaped component 1 according to the invention, with only the coloring cover plate 2 being shown. To avoid unnecessary repetition, only the differences are described and otherwise reference is made to the above explanations. Accordingly, the back surface 5 of the coloring cover plate 2 of the plate-shaped component 1 has a structured region 8 on which a color filter layer 9 is arranged. Furthermore, the front surface 4 of the coloring cover plate 2 also has a structured region 8'. No color filter layer is arranged on the front surface 4. The two structured regions 8, 8' can be the same or different from each other. In the embodiment example of FIG. 25, all segments 10 have a maximum inclination angle of 45°. In contrast to the segments 10 of the structured region 8 of the back surface 5, there is no condition for the roughness for the segments 10' of the structured region 8' of the front surface 4 of the plate-shaped component 1 of FIG. 25.

Such an additional layer arranged on the front surface 4 can also be a thin, color-neutral anti-reflective layer which has an optical refractive index smaller than that of the coloring cover plate 2. This suppresses the essentially white reflection of the coloring cover plate 2 (e.g., glass) and increases the degree of saturation of the colors. However, an additional layer arranged on the front surface 4 can also have the same optical refractive index as the coloring cover plate 2. In this case, the layer serves only to protect the coloring cover plate 2 from moisture and other corrosive components of the air. It has been shown that satinized glasses produced by etching are more sensitive to moist heat than planar or rolled glasses. In the case of etched soda-lime glass, the additional layer may be, for example, a thin sputtered $SiO_2$ layer.

In these embodiments, the light must pass at least once through the coloring cover plate and must be reflected off the internal color filter layer in order to achieve the desired coloration with the improved angular stability after exiting the front surface.

In principle, the plate-shaped component 1 can be mounted on a facade using any suitable fastening technique, for example back rails, drilled point holders, clamping strips, etc. The fastening technique can also be used for the mounting of the plate-shaped component 1 on the facade. Suspension systems are frequently used in curtain wall-ventilated facades, in which the joint connection is realized by means of a form fit.

FIG. 26 illustrates the measuring arrangement for determining the diffuse scattering of the plate-shaped component 1 according to the invention using a commercially available multi-angle colorimeter 17 (multi-angle color measurement). The structured region 8, which is not shown in more detail, extends over the complete coloring cover plate 2 (e.g., glass). Here, a light beam is directed onto the front surface 4 of the plate-shaped component 1 to be characterized at different angles of incidence and the scattered or reflected light is spectrally measured from different observation angles, for example 15° or 45° to the surface normal of the plane of the coloring cover plate 2. Beneath the coloring cover plate 2 is an opaque back element 14, which is formed here, for example, as a black, non-glossy layer (e.g., bonded with a liquid having a refractive index at about 1.5). The multi-angle colorimeter 17 can be used to determine the brightness in the L-a-b system with D65 standard illumination and 10° aperture angle. It has been shown that good angular stability (i.e., low angular dependence of the scattered light) is provided when both at 45° and at 15° angle of observation and at an angle of incidence of 45°, each measured from the gloss angle, there is still at least a brightness of L=10, preferably L=15 and even better L=20. Due to the at least one structured region 8 of front surface 4 and/or back surface 5 of the coloring cover plate 2, at least a brightness of L=10 can be achieved both at 45° and at 15° angle of observation and at an angle of incidence of 45°, in each case measured from the gloss angle (in both directions). The degrees are to be understood as follows: Reflection angle (referred to surface normal/incidence angle (referred to gloss angle). For example, with an observation angle of 45° (measured relative to the surface normal) and an incidence angle of 45° (measured from the gloss angle), the incident beam is incident exactly perpendicular to the surface (45/45). With an angle of observation of 15° and an angle of incidence of 45°, the direction of incidence is 30° from the surface normal on the same side as the direction of observation (15/45). The multi-angle colorimeter 20 is positioned relative to the surface normal at an observation angle of 45° or 15°.

FIG. 5 shows the height profile (angular distribution) from a confocal microscopy measurement of an only slightly structured glass pane (type A), a more strongly structured pane (specially etched glass, type B), as well as another suitably structured glass (type C). While in the case of the lightly structured pane (type A) the structures are very large and inclination angles of only 5-10° occur, the structure of the etched pane of type B is in the range 80-100 μm (distance mountain to mountain in the plane of the glass) with mean angles of approx. 17°. Measured with a profilometer, mean structure depths of 14 μm (height mountain to valley) are obtained. As can be seen in FIG. 5, for the lightly textured glass (type A), there is little intensity of reflection (measured as L-value) at angles greater than 20-30° from the gloss angle. With the textured glass of type B, one still sees clear brightness at 45as45 or 15as45. If we measure height profiles on the type B glass, we find characteristic structural properties: the aspect ratio of width (B) to height (H) of the structures is between B:H>3:1 and B:H<10:1, structures with tilt angle of 45° would have an aspect ratio of 2:1. Another suitable structured glass (type C) has a similar distribution of the angles of the surface segments and also a good angular stability of L measured in the multi-angle colorimeter. However, the structure sizes are much smaller:

the mountain to mountain distance is 30 μm and the mountain to valley height is 4 μm. This again results in a similar average tilt angle of 16° as for type B. Essential to the angular distribution of brightness is the very similar distribution of inclination angles, not the absolute structure size, at least in a very wide size range from a few micrometers to a few hundred micrometers. Other distributions with average inclination angles of 20°-30° can also be advantageous. If the inclination angles are too steep, the probability of multiple reflection increases significantly.

Figure 6:
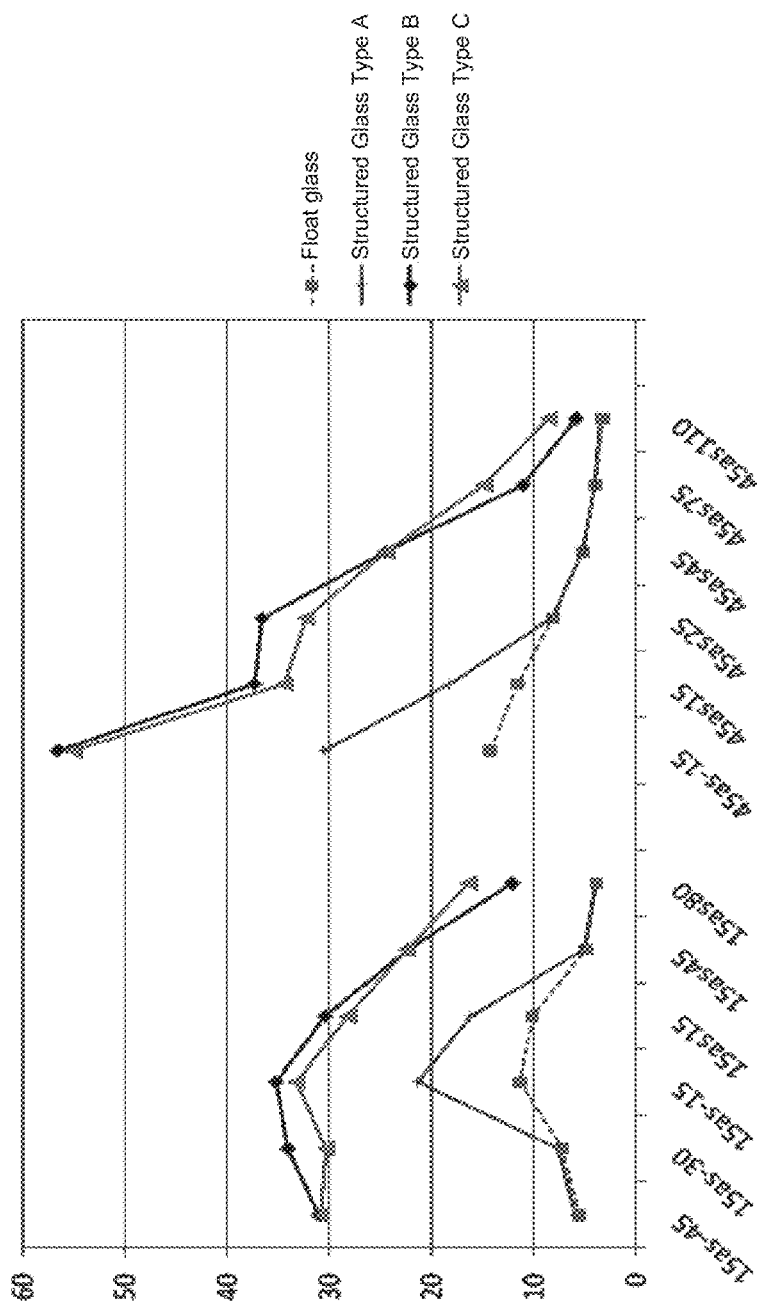

FIG. 6 is a graph showing the brightness of uncoated structured glasses measured with a multi-angle colorimeter (x-rite MA-T12). On the back of the front glasses, a matte glass blackened on both sides was optically bonded with the aid of a thin layer of glycerine (refractive index n=1.47), so that essentially the reflection of the textured surface was measured. The structured front glass suitable according to the invention (e.g., type B or C, Haze 92%-94%) shows overall a significantly higher intensity of diffuse reflected light than a lightly textured solar glass (type A, rolled glass, Haze=2%) or an unstructured float glass (Haze <0.5%). The planar float glass has reflection only in the gloss angle, which is not measured by this method. Especially at angles far away from the gloss angle, a clear brightness can still be seen with the glass structured according to the invention. This effect can be used advantageously in combination with a color filter layer.

According to an embodiment, the plate-shaped component according to the invention has at least one structured side on the outside and at least one color filter layer on the outside. Since at least one color filter layer is applied to a diffusely scattering glass element, microscopic surface elements are found for different viewing angles, the inclination of which fulfill the reflection condition angle of incidence=angle of reflection. This results in an average color impression that less dependent on direction. According to a further embodiment, there is at least one color filter layer inside and at least one structured side (outside or inside) or both sides are structured. Due to the diffuse effect of the at least one structured layer, there are many different light paths that lead to reflection at the color filter layer on the inside and emerge again in different directions, so that a significantly greater angular stability of the brightness is achieved than with glass that is smooth on both sides. In these cases, the light must have traveled at least once through the glass and back out again to produce the desired color effect at different angles, even away from the gloss angle.

If the structured side and the at least one color filter layer are on the outside, the diffuse effect of the at least one structured surface means that there are many different light paths that lead to reflection in different directions at the color filter layer on the outside, so that significantly greater angular stability of brightness is achieved than with glass that is smooth on both sides. In any case, the structure must have facets and structure sizes in extents greater than the wavelength of visible light. To be able to create interference in the color filter layer for an incident wavefront, the surface segments must be sufficiently planar, e.g., have a roughness less than 15% or less than 10% of the thickness of the color filter layer. In order to allow interference conditions for constructive or destructive interference even at oblique incidence on a layer with a maximum thickness of several hundred nanometers, the surface segments must have a minimum size: a size of 1 μm edge length or diameter is required, otherwise the wave packet reflected directly at the upper interface cannot interfere with the wave packet reflected at the lower interface and exiting laterally offset. With increasing angle of incidence and increasing layer thickness, the exit point of the beam reflected at the lower interface is increasingly laterally displaced on the segment.

Suitable glasses can be produced by etching, for example, with structures ranging in size from a few micrometers to several 10 μm. However, the structure sizes can also be in the submillimeter range, for example as in rolled glasses. The structures should preferably have different surface inclinations with broad distributions of the inclination angles. The structures can also be produced by laser or by applying and structuring a transparent cover layer using printing techniques or similar.

The at least one color filter layer 9, 9' of the plate-shaped component 1 contains at least one highly refractive layer made of a material with a refractive index n of greater than 2.5 in the wavelength range from 400 nm to at least 700 nm and an extinction coefficient of at least 0.2 below 450 nm and less than 0.2, preferably less than 0.1, above 700 nm. Optionally, the at least one color filter layer 9, 9' may comprise at least one refractive layer made of a transparent dielectric material having a refractive index of less than 2.5. It has already been stated at the outset that it may be advantageous if the at least one color filter layer 9, 9' has a double layer comprising a high refractive index layer (HTM) and a low refractive index layer (TD), a triple layer in which a high refractive index layer (HTM) is disposed between two low refractive index layers (TD), or a low refractive index layer (TD) is disposed between two high refractive index layers (HTM), or a quadruple layer in which two high refractive index layers (HTM) and two low refractive index layers (TD) are arranged in alternating sequence, wherein a high refractive index layer (HTM) is arranged between two low refractive index layers (TDS) and a low refractive index layer (TD) is arranged between two high refractive index layers (HTM).

When using non-absorbing materials like $Si_3N_4$, $SiO_2$, SiON, $ZrO_2$ or $TiO_2$ (typical dielectrics) for the color filter layer, the choice of available refractive indices is limited to values below n=3 in the visible (380 nm-780 nm). Simulations (transfer matrix method) show that with a thin $Si_3N_4$ layer (e.g. 50-70 nm) on glass one can produce an achromatic reflection (chromaticity c<3) with a luminance of L=55. With $ZrO_2$ one gets to L=60 and with $TiO_x$ one gets up to L=70 (see also table 1 inserted below).

TABLE 1

(Layer packages for white shades)

| Layer package | L | a | b | C | ΔE20°-50° | Jsc-loss | R | G | B |
|---|---|---|---|---|---|---|---|---|---|
| 60 nm Si3N4/glass | 55 | −2.2 | −2.3 | 3.2 | 1.4 | −14.9 | 125 | 133 | 135 |
| 50 nm TiOx/glass | 69 | −2.8 | −1.7 | 3.3 | 1.3 | −29.1 | 162 | 170 | 172 |
| 24 nm a-Si/glass | 85 | −3.1 | 1.1 | 3.3 | 1.3 | −48.8 | 206 | 213 | 209 |

TABLE 1-continued (Layer packages for white shades)

| Layer package | L | a | b | C | ΔE20°-50° | Jsc-loss | R | G | B |
|---|---|---|---|---|---|---|---|---|---|
| 24 nm c-Si/glass | 84 | −2.7 | −7 | 7.5 | 1.5 | −48.4 | 198 | 212 | 223 |
| 20 nm SiO2/20 nm a-Si/glass | 83 | −3.4 | 0 | 3.4 | 2.3 | −44.3 | 199 | 207 | 205 |
| 10 nm Si3N4/20 nm a Si/glass | 83 | −3.3 | 0.5 | 3.3 | 1.6 | −45.7 | 201 | 209 | 206 |
| 14 nm a-Si/100 nm SiO2/22 nm a-Si/glass | 90 | −3 | 0.7 | 3.1 | 4.6 | −36.3 | 220 | 227 | 224 |
| 16 nm a-Si/85 nm SiO2/26 nm a-Si/glass | 90 | −2.9 | 1.8 | 3.4 | 4.7 | −37.3 | 222 | 228 | 223 |
| 10 nm SiO2/110 nm-a-Si/110 nm SiO2/20 nm-a-Si | 90 | −2.8 | 0.5 | 2.9 | 4 | −39 | 222 | 229 | 226 |
| 130 nm SiO2/10 nm-a-Si/60 nm SiO2/35 nm-a-Si | 87 | −2.8 | −0.6 | 2.9 | 4 | −38 | 211 | 219 | 218 |
| 10 nm SiN/20 nm-a-Si/120 nm SiO2/20nm-a-Si | 90 | −2.8 | 0.8 | 2.9 | 4.3 | −37.8 | 219 | 226 | 223 |

For a white color impression, however, values of L=85 and above are required. With more complex multilayers of these materials in combination with $SiO_2$, ΔL=5-10 higher can be achieved. However, the required layer thicknesses become very high and the angle dependence increases significantly. $TiO_x$ has also proven to be critical due to its catalytic effect and activation by UV. Solar modules with $TiO_x$ coatings on the inside showed significant reactions between the color coating and the edge seal. Even with outer coatings, degradation and optical defects were still visible due to sputtering to the inner side.

To obtain white tones (L>80, c<3.5), the reflection in the visible must be R=65% on average. The relevant wavelength range is between 400 nm and 70 0 nm. If this is to be achieved with simple layer systems consisting of a few layers, the refractive index of the materials must be greater than 3.0, preferably greater than 3.5. Above 700 nm, the transmission should be above 80%, preferably above 90%, to achieve the highest possible efficiency. Absorption and reflection must be correspondingly small. Solar cells made of silicon or of CIGS still have a high spectral sensitivity between 700 nm and 1250 nm. To reduce the loss of efficiency compared to solar modules with normally transparent front glasses, the color filters should be as transparent as possible in the near infrared.

From semiconductor physics publications and textbooks, the refractive index and extinction coefficient characteristics of crystalline, microcrystalline, and hydrogen-passivated amorphous silicon (a-Si:H) and other semiconductors such as GaP, GaAs, or Ge are well known (e.g., Seyed Sadreddin Murshafieyan and Junpeng Guo, Opt. Express 22, 31545-31554 (2014)). Characteristically, these materials have a very high refractive index above n=3 throughout the visible wavelength range from 380 nm to 780 nm with maxima in the 300-400 nm range with values from n=4 to high to n=7. The extinction coefficient is very high for these materials in the 250-250 nm range with values k=2 to above k=6. Above 400-500 nm, however, the extinction coefficient drops significantly to values below 0.2 and ultimately below 0.01 in the near infrared (NIR) above 800 nm.

Also suitable are mixed systems of amorphous silicon, hydrogen, and the elements C, Ge, or O. By adding O, C, and Ge, the optical properties can be further modified to obtain high reflection, low chromaticity, and high transmission in the NIR. Materials with the above conditions for refractive index and extinction coefficient are materials for the high refractive index layer according to the invention. Transparent insulating dielectrics with refractive index <2.2 and k=0 such as $S_2O_2$, $S_3N_4$, SiON are materials for the low refractive index layer according to the invention.

Mixed systems of silicon with nitrogen are also suitable: starting from stoichiometric $Si_3N_4$, increasing the ratio of silicon to nitrogen raises the refractive index and creates an absorption edge in the blue. With admixtures of oxygen, the optical properties can be further varied, so that general silicon rich SION coatings are suitable. Preferably, the nitrogen content should be larger than the oxygen content.

All silicon-based materials can also contain aluminum. To improve the sputtering process, sputtering targets with up to 10% aluminum in the silicon are used.

Furthermore, there are also various transition metal oxides (e.2., $Cu_2O$ or $Fe_2O_3$) with the above mentioned suitable optical properties. Even some metal sulfides or metal selenides (such as $Mo_2S_3$; or $Mo_2Se_3$) have equally suitable optical properties. However, adhesion and stability problems may occur with the metal sulfoselenides due to their low hardness and adhesion.

To avoid problems regarding electrical insulation or PID (Potential Induced Degradation), the layers should be undoped and highly insulating. The resistance R of the layers/layer stacks should not be less than 10 GOhm, better not less than $10^2$ GOhm, at a voltage of 1000 V and a measuring electrode distance of 2 cm in daylight. The specific dark resistance should be above $10^{10}$ Ωcm, better above $10^{11}$ Ωcm.

By using multilayers with typical dielectrics such as $SiO_2$, $S_3N_4$, SiON with refractive index <2.2, the current losses can be reduced even further. Examples of triple layers can be found in table 1 above.

In summary, the following color filter layers on textured glass in one of the above configurations (texture inside, outside or both sides and coating inside, outside or both sides) are suitable for whites (L>80, c<3.5):

Highly refractive and partially transparent materials HTM) with a refractive index greater than 3.0 preferably greater than 3.5, in the wavelength range 400 nm to 700 nm and an extinction coefficient less than 0.2 preferably less than 0.1, above 700 nm, preferably above 500 nm. Examples of particularly suitable HTM are: crystalline or microcrystalline Si, amorphous a-S:H, a-SiC:H, a-SiO:H, a-SiGe:H, silicon rich $Si_xN_y$, silicon rich $Si_xN_yO_z$ (y>z). The layer thicknesses of HTM should be less than 30 nm and greater than 5 nm. The resistivity R of the layers/layer stacks should be not less than 10 GOhm, better not less than $10^2$ GObm, at a voltage of 1000 V and a measuring electrode distance of 2 cm in daylight. The specific dark resistance should be above $10^{10}$ Ωcm, better above $10^{11}$ Ωcm.

For example, the color filter layer has exactly one high refractive index (HTM) layer (single layer).

For example, the color filter layer has exactly one high refractive index (HTM) layer and exactly one low refractive index (TD) layer (double layer). I.e. a double layer of glass/HTM/TD or TD/HTM/glass. In the case of external coating, the top layer of DT should be on top, i.e. on the very outside in contact with the air, and in the case of internal coating on the very inside in contact with the lamination film.

The color filter layer has, for example, exactly one high refractive index layer (HTM) and exactly two low refractive index layers (TD) or alternatively exactly one low refractive index layer (TD) and exactly two high refractive index layers (HTM) (triple layer). I.e., a triple layer HTM/DT/HTM/glass or glass/DT/HTM/DT or glass/DT/HTM/DT or DT/HTM/DT/glass.

The color filter layer has, for example, exactly two high refractive index layers (HTM) and exactly two low refractive index layers (TD), which are arranged alternately (quadruple layer). I.e., a quadruple layer of glass/HTM/DT/HTM/DT or DT/ATM/DT/HTM/Glass.

Red plate-shaped components, especially solar modules, cannot be produced on an interference basis with single or double layers of the usual dielectric transparent materials (TD) such as $Si_3N_4$, $ZrO_2$ or $TiO_x$. With a single layer of $Si_3N_4$ or $TiO_x$, the first-order maximum can be shifted into the red wavelength range (>600 nm) by increasing the layer thickness, bat the second-order maximum then already appears in the blue. The distance between the maxima increases with decreasing refractive index, but the distance is already too small even for low refractive indices (between 1 and 1.5). Furthermore, the interference maxima are too wide for single or double layers: In the human eye, the spectral absorption curves of the photoreceptors' visual pigments for red (L cones) and green (M cones) overlap very strongly. For a strong red tone, the difference between the signals of the L cones and the M cones is decisive. For a red tone that is as saturated as possible, a relatively steep rise in the color spectrum between 580 nm and 620 nm is required. An excessively planar rise then leads to yellow tones from the mixture of red and green. The shift due to increasing layer thickness then always leads from gold tones to violet or purple tones in the same way.

With the color filters based on HTM, it is possible to produce far better low-blue and angularly stable red tones. Two different properties contribute to this: first, the refractive index is very high. This reduces the necessary layer thickness for matching color filter layers. This results in significantly improved angular stability. Secondly, the higher absorption in the blue leads to a reduction of the blue component in the reflection spectrum.

Figure 7:
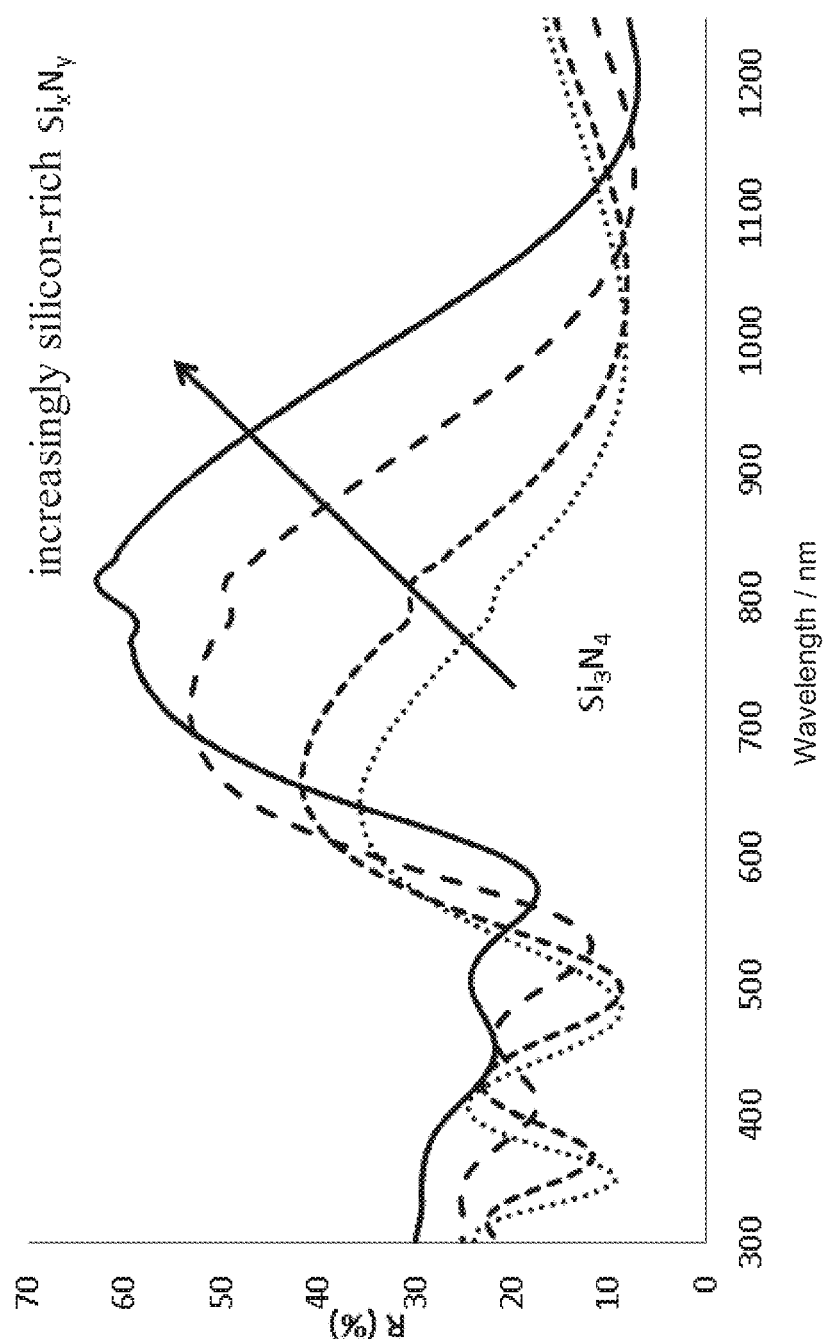
FIGS. 7-8 Reflectance and absorption spectra of increasingly silicon rich $Si_xN_y$ layers on planar float glass.
Figure 8:
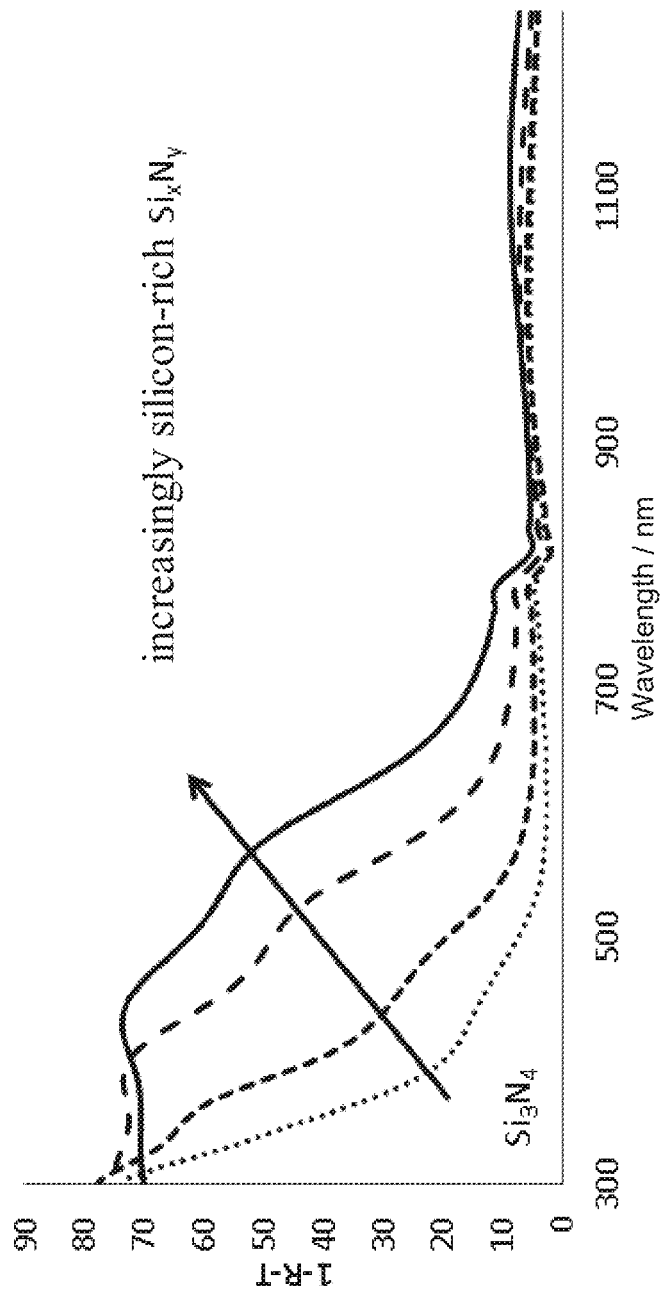

FIG. 6 shows reflection spectra of $Si_xN_y$ on glass with increasing silicon content and FIG. 7 shows absorption spectra (A=1-T-R) of increasingly silicon rich $Si_xN_y$ layers on planar float glass. The film thickness is about 260 nm. With increasing silicon content, the reflection in the red spectral range increases significantly, while the blue component decreases. With increasing silicon content, absorption in the blue increases.

With such single layers of silicon rich $Si_xN_y$, a red-purple solar module with L=41, h=3 and c=31 could be produced on structured glass as an inner coating and a solar module in old-pink with L=60, h=29 and c=31 as an outer coating (measured in Di:8°, DOS). By combining with a thin layer of $SiO_2$ (or another TD), the blue tint can be further suppressed and the layer is protected against moisture. Furthermore, as with the white modules, the top layer leads to better electrical insulation, With multilayer stacks and thick layers, red hues can be generated from the transparent dielectric materials (1.5<n<2.8) such as $TiO_x$, $SiO_2$, $Si_3N_4$ or $ZrO_2$ even without HTM. However, due to the relatively high total layer thickness and the long optical path lengths, the angular stability is too low: the color tint changes too much under different observation and illumination angles. At larger angles, the maximum shifts from the red to the yellow-orange region: e.g., a layer package of 110 nm-SiN-90 nm $SiO_2$-90SiN $TiO_2$ on glass gives a terracotta red with L=47.2 a=38.9 and b=20.8. However, between 20° and 50°, the color changes by ΔE=42 to a gold tint.

The HTMs can be used to produce red tones with much smaller layer thicknesses using triple or quadruple layers. For example, one can create a red tone m the simulation with amorphous silicon that corresponds to the terracotta red shown above: 4 nm aSi-45 nm SiN-18 nm aSi glass with L=47, a=36, b=19. The ΔE=13 between 20° and 50° shows the much greater angular stability compared to the ΔF=42 shown above due to the much smaller optical path length. The estimated current loss here is 30%.

Strong reds can also be simulated with the n and k dispersion data of crystalline Si with triple or quadruple layers. Further examples can be found in Table 2 below.

TABLE 2

Layer packages for red shades

| Layer package/glass | L | a | b | C | h | ΔE20° 50° | Jsc-loss | R | G | B |
|---|---|---|---|---|---|---|---|---|---|---|
| 50 nm SiN/40 nm a-Si | 37.5 | 46.7 | 17 | 49.7 | 20 | 9.9 | −37 | 158.9 | 47.9 | 63.4 |
| 4 nm a-Si/45 nm SiN/ 18 nm a-Si | 47.2 | 36.3 | 19.1 | 41 | 27.7 | 12.8 | −28.5 | 175 | 85 | 82 |
| 8 nm a-Si/45 nm SiO2/ 30 nm a-Si | 50.7 | 43 | 16.2 | 46 | 20.6 | 14.8 | −36.6 | 193 | 87 | 95 |
| 10 nm a-Si/20 nm SiO2/28 nm a-Si | 53.5 | 43.5 | 1 | 43.5 | 1.3 | 12 | −40.3 | 196 | 95 | 128 |
| 40 nm SiN/45nm c-SI/ 40 nm SiN | 41.1 | 37.5 | 15.5 | 40.6 | 22.4 | 11.5 | −33.6 | 157.6 | 68.6 | 73.5 |
| 50 nm SiN/30 nm c-Si/ 10 nm SiN/10 c-Si | 41 | 33.1 | 27.2 | 42.9 | 39.4 | 10.2 | −31.5 | 154.9 | 72.1 | 53.8 |
| 50 nm SiN/40 nm a-Si/ 90 nm SiN/50 nm a-Si | 43.3 | 62.1 | 59.8 | 86.2 | 43.9 | 13.7 | −51.1 | 200.4 | 32.5 | 0 |

TABLE 2-continued

Layer packages for red shades

| Layer package/glass | L | a | b | C | h | ΔE20° 50° | Jsc-loss | R | G | B |
|---|---|---|---|---|---|---|---|---|---|---|
| 60 nm SiN/10 nm a-Si/ 110 nmSiN/50 nm a-Si | 45.8 | 59.4 | 42.7 | 73.1 | 35.7 | 23.2 | −41.6 | 203.7 | 48.8 | 40 |

Thus, for the production of more angularly stable, saturated and low-blue red tones, color filters on the structured glass elements (inside, outside or both sides) with the same characteristics as above are suitable, with the following changes:

The color filters contain at least one or more layers of a highly refractive and partially transparent material (HTM) with a refractive index greater than 2.5 preferably greater than 3.0, in the wavelength range 400 nm to at least 700 nm and an extinction coefficient of at least 0.2 below 450 nm and less than 0.2, preferably 0.1, above 700 nm, preferably above 500 nm. The layer thicknesses of the HTM can be in the range of 5 nm to 300 nm.

White and red plate-shaped components are the main applications of the color filters described above on structured front glass with HTM. However, it is also possible that the interesting properties (high refractive index in VIS, low absorption above 700 nm or above 500 nm) can be used for other colors.

With a double layer TD/HTM/glass, a range of bright, highly saturated colors with good angular stability and moderate efficiency loss can be produced with a thin layer of HTM and layer thicknesses of TD in the range of 50-150 nm, such as blue from 110 nm SiN/10 nm/glass with L=50, c=46, h=245, E20°50°=11 and Jsc-loss=−15%. The possible combinations are numerous. The essential is the 1 or 2 layers of HTM alternating with a transparent dielectric TD.

The HTMs can be deposited on glass by various known coating processes: reactive sputtering, CVD, ALD, evaporation (thermal or electron beam), etc. Since the film thicknesses are relatively small, ALD would be recommended. ALD and CVD also result in good conformal coverage of the structured surface.

As can be seen from the above description of the invention, the invention provides an improved plate-shaped component which has a very homogeneous, intense color, with little or no directional dependence. In particular, the plate-shaped component can be provided with a white or red color in a particularly advantageous manner. The plate-shaped component can be manufactured cost-effectively in various shapes and sizes and can be integrated in a simple manner into a facade, for example. The invention thus provides an innovation that brings considerable advantages in the practice of facade construction and in the possible applications of solar modules as colored modules for roof mounting or open spaces.

The invention claimed is:

1. A plate-shaped component, comprising:
a transparent cover plate; and
at least one planar back element attached to the transparent cover plate,
wherein the transparent cover plate has a front surface facing an external environment and a back surface facing the at least one planar back element,
wherein at least one surface selected from the front surface and the back surface has at least one structured region, and wherein at least one color filter layer for reflecting a light within a predetermined wavelength range is arranged on the at least one surface selected from the front surface and the back surface,
wherein the at least one structured region has the following features i) to iii):
   i) perpendicular to a plane of the transparent cover plate, a height profile comprising peaks and valleys, wherein a mean height difference between the peaks and the valleys is at least 2 µm;
   ii) at least 50% of the at least one structured region is composed of segments inclined to the plane of the transparent cover plate, wherein, relative to the plane of the transparent cover plate, at least 20% of the segments have an angle of inclination in a range from greater than 0° to a maximum of 15° and at least 30% of the segments have an angle of inclination in a range from greater than 15° to a maximum of 45°, wherein
   iii) the segments are each planar and have a segment area of at least 1 µm², wherein the segments each have an average roughness of less than 15% of a layer thickness of the at least one color filter layer,
wherein the at least one color filter layer comprises at least one high refractive index layer, wherein the at least one high refractive index layer has a refractive index of greater than 2.5 in a wavelength range from 400 nm to at least 700 nm and an extinction coefficient of at least 0.2 below 450 nm and less than 0.2 above 700 nm; and
wherein the at least one structured region has a reflection haze of more than 50%, and wherein the cover plate is configured such that, when provided with a black inner surface and illuminated on an illuminated surface opposite the black inner surface at an angle of incidence which deviates by 45° from a gloss angle, a brightness L of a reflected light with a color effect is achieved at observation angles of 45° and 15°, wherein the observation angles are based on a normal relative to the cover plate, L being selected from the group consisting of at least 10, at least 15 and at least 20.

2. The plate-shaped component according to claim 1, wherein the at least one high refractive index layer has a layer thickness in a range from 5 nm to 300 nm.

3. The plate-shaped component according to claim 1, wherein the at least one high refractive index layer has the refractive index greater than 3.0 in the wavelength range from 400 nm to at least 700 nm and a layer thickness in a range from 5 nm to 40 nm.

4. The plate-shaped component according to claim 1, wherein the at least one color filter layer comprises at least one low refractive index layer of a transparent dielectric material, the at least one low refractive index layer has a refractive index of less than 2.5.

5. The plate-shaped component according to claim 4, wherein the at least one low refractive index layer has a layer thickness greater than 10 nm and less than 250 nm.

6. The plate-shaped component according to claim 1, wherein the at least one color filter layer comprises:
   a double layer consisting of a high refractive index layer and a low refractive index layer, or
   a triple layer having a high refractive index layer sandwiched between two low refractive index layers, or a low refractive index layer sandwiched between two high refractive index layers, or
   a quadruple layer having two high refractive index layers and two low refractive index layers arranged in an alternating sequence, wherein a high refractive index layer is arranged between two low refractive index layers and a low refractive index layer is arranged between two high refractive index layers.

7. The plate-shaped component according to claim 1, wherein the back element comprises a supporting substrate with solar cells for a photovoltaic energy generation.

8. The plate-shaped component according to claim 1, wherein the back element is formed as:
   a coating of the transparent cover plate, wherein the coating is an opaque coating,
   a film firmly bonded to the transparent cover plate by a transparent adhesive, wherein the film is an opaque film, and the transparent adhesive is a transparent adhesive film, or
   a rigid body firmly bonded to the transparent cover plate by a transparent adhesive, wherein the rigid body is an opaque rigid body, and the transparent adhesive is a transparent adhesive film.

9. The plate-shaped component according to claim 1, wherein the back element comprises a mechanically supporting pane.

10. The plate-shaped component according to claim 1, wherein the front surface of the transparent cover plate has a first structured region of the at least one structured region, a a first color filter layer of the at least one color filter layer is arranged on the first structured region for reflecting the light within the predetermined wavelength range.

11. The plate-shaped component according to claim 10, wherein
   i) the back surface of the transparent cover plate has no structured region and no color filter layer, or
   ii) the back surface of the transparent cover plate does not have a structured region and a second color filter layer of the at least one color filter layer is arranged on the back surface of the transparent cover plate for reflecting the light within the predetermined wavelength range, or
   iii) the back surface of the transparent cover plate has a second structured region of the at least one structured region, a second color filter layer of the at least one color filter layer is arranged on the second structured region for reflecting the light within the predetermined wavelength range.

12. The plate-shaped component according to claim 1, wherein a first color filter layer of the at least one color filter layer for reflecting the light within the predetermined wavelength range is arranged on the back surface of the transparent cover panel, the back surface and/or the front surface each have the at least one structured region, either the front surface has the at least one structured region or a second color filter layer of the at least one color filter layer for reflecting the light within the predetermined wavelength range is arranged on the front surface.

13. The plate-shaped component according to claim 12, wherein
   i) the back surface of the transparent cover plate has no structured region and the front surface has the at least one structured region, wherein no color filter layer is arranged on the front surface, or
   ii) the back surface of the transparent cover plate has a first structured region of the at least one structured region and the front surface has a second structured region of the at least one structured region, wherein no color filter layer is arranged on the front surface, or
   iii) the back surface of the transparent cover plate has the at least one structured region and the front surface has no structured region, wherein no color filter layer is arranged on the front surface, or
   iv) the back surface of the transparent cover plate has the at least one structured region and the front surface has no structured region, the second color filter layer is arranged on the front surface.

14. A plate-shaped component, comprising:
   a transparent cover plate; and
   at least one planar back element attached to the transparent cover plate;
   wherein the transparent cover plate has a front surface facing an external environment and a back surface facing the at least one planar back element,
   wherein at least one surface selected from the front surface and the back surface has at least one structured region, wherein
      perpendicular to a plane of the transparent cover plate, the at least one structured region has a height profile comprising peaks and valleys, at least 50% of the at least one structured region is composed of segments inclined to the plane of the transparent cover plate, and the segments are each planar; and
   wherein at least one color filter layer for reflecting a light within a predetermined wavelength range is arranged on the at least one surface selected from the front surface and the back surface, and the at least one color filter layer comprises at least one high refractive index layer and at least one low refractive index layer, wherein
      the at least one high refractive index layer has a refractive index of greater than 2.5 in a wavelength range from 400 nm to at least 700 nm and an extinction coefficient of at least 0.2 below 450 nm and less than 0.2 above 700 nm, and the at least one low refractive index layer is of a transparent dielectric material, and has a refractive index of less than 2.5.

15. The plate-shaped component according to claim 14, wherein the at least one high refractive index layer has a layer thickness in a range from 5 nm to 40 nm, and the at least one low refractive index layer has a layer thickness greater than 10 nm and less than 250 nm.

16. The plate-shaped component according to claim 14, wherein wherein the at least one color filter layer comprises:
   a double layer consisting of a high refractive index layer and a low refractive index layer, or
   a triple layer having a high refractive index layer sandwiched between two low refractive index layers, or a low refractive index layer sandwiched between two high refractive index layers, or
   a quadruple layer having two high refractive index layers and two low refractive index layers arranged in an alternating sequence, wherein a high refractive index layer is arranged between two low refractive index layers and a low refractive index layer is arranged between two high refractive index layers.

17. A plate-shaped component, comprising:
a transparent cover plate; and
at least one planar back element attached to the transparent cover plate;
wherein the transparent cover plate has a front surface facing an external environment and a back surface facing the at least one planar back element,
wherein at least one surface selected from the front surface and the back surface has at least one structured region, wherein
perpendicular to a plane of the transparent cover plate, the at least one structured region has a height profile comprising peaks and valleys, at least 50% of the at least one structured region is composed of segments inclined to the plane of the transparent cover plate, and the segments are each planar; and
wherein at least one color filter layer for reflecting a light within a predetermined wavelength range is arranged on the at least one surface selected from the front surface and the back surface, and wherein a first color filter layer of the at least one color filter layer is arranged on the back surface, wherein
the at least one color filter layer comprises at least one high refractive index layer, wherein the at least one high refractive index layer has a refractive index of greater than 2.5 in a wavelength range from 400 nm to at least 700 nm and an extinction coefficient of at least 0.2 below 450 nm and less than 0.2 above 700 nm.

18. The plate-shaped component according to claim 17, wherein a second color filter layer of the at least one color filter layer for reflecting the light within the predetermined wavelength range is arranged on the front surface.

19. The plate-shaped component according to claim 17, wherein the back surface has a first structured region of the at least one structured region, and the first color filter layer of the at least one color filter layer is arranged on the first structured region of the at least one structured region.

20. The plate-shaped component according to claim 17, wherein
i) the back surface of the transparent cover plate has no structured region and the front surface has the at least one structured region, wherein no color filter layer is arranged on the front surface, or
ii) the back surface of the transparent cover plate has a first structured region of the at least one structured region and the front surface has a second structured region of the at least one structured region, wherein no color filter layer is arranged on the front surface, or
iii) the back surface of the transparent cover plate has the at least one structured region and the front surface has no structured region, wherein no color filter layer is arranged on the front surface, or
iv) the back surface of the transparent cover plate has the at least one structured region and the front surface has no structured region, and the second color filter layer is arranged on the front surface.

\* \* \* \* \*